US012660441B2

(12) United States Patent (10) Patent No.: US 12,660,441 B2
Cho et al. (45) Date of Patent: Jun. 16, 2026

(54) DISPLAY APPARATUS

(71) Applicant: Samsung Display Co., Ltd., Yongin-si (KR)

(72) Inventors: Daeyoun Cho, Yongin-si (KR); Jongwoo Park, Yongin-si (KR); Youngtae Choi, Yongin-si (KR); Sangkil Kim, Yongin-si (KR); Jiho Moon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 629 days.

(21) Appl. No.: 17/990,847

(22) Filed: Nov. 21, 2022

(65) Prior Publication Data

US 2023/0165084 A1      May 25, 2023

(30) Foreign Application Priority Data

Nov. 19, 2021      (KR) ........................ 10-2021-0160707

(51) Int. Cl.
 *H10K 59/131*      (2023.01)
 *H10K 59/126*      (2023.01)
(52) U.S. Cl.
 CPC ......... *H10K 59/131* (2023.02); *H10K 59/126* (2023.02)
(58) Field of Classification Search
 None
 See application file for complete search history.

(56) References Cited

U.S. PATENT DOCUMENTS

| | | | |
|---|---|---|---|
| 6,411,501 | B1 | 6/2002 | Cho et al. |
| 10,437,284 | B2 | 10/2019 | Kwak et al. |
| 10,978,538 | B2 | 4/2021 | Wang et al. |
| 11,367,399 | B2 * | 6/2022 | Jung ..................... H10K 59/131 |
| 2019/0081090 | A1 * | 3/2019 | Lee ......................... H10D 86/60 |
| 2020/0203382 | A1 | 6/2020 | Jung et al. |
| 2020/0357878 | A1 * | 11/2020 | Jo ...................... H10K 59/8791 |
| 2020/0379595 | A1 | 12/2020 | Kim |
| 2021/0126223 | A1 * | 4/2021 | Choi .................... H10K 77/111 |
| 2021/0201795 | A1 | 7/2021 | Cho et al. |

FOREIGN PATENT DOCUMENTS

| | | | | |
|---|---|---|---|---|
| KR | 10-0501594 | | 7/2005 | |
| KR | 10-2018-0085627 | | 7/2018 | |
| KR | 10-2020-0029103 | A | 3/2020 | |
| KR | 10-2020-0076302 | | 6/2020 | |
| KR | 10-2020-0138544 | | 12/2020 | |
| KR | 10-2021-0068124 | A | 6/2021 | |
| WO | WO-2020072394 | A1 * | 4/2020 | ......... H01L 27/3293 |

* cited by examiner

*Primary Examiner* — Yara B Green
*Assistant Examiner* — Erika H Son
(74) *Attorney, Agent, or Firm* — F. CHAU & ASSOCIATES, LLC

(57)      ABSTRACT

A display apparatus includes a metal plate including an indentation portion indented inward from a side of the metal plate, and a display panel located on the metal plate. The display panel includes a substrate including a display area and a peripheral area surrounding at least part of the display area, a metal wiring located on the substrate, and including a first portion overlapping or adjacent to the indentation portion in a plan view, a gate driving part located on the substrate, overlapping the metal plate in a plan view, and located adjacent to the metal wiring, and a shielding portion located between the substrate and the metal wiring, and overlapping at least a part of the indentation portion in a plan view.

20 Claims, 21 Drawing Sheets

DISPLAY APPARATUS

CROSS-REFERENCE TO RELATED APPLICATION

This application claims priority to and benefits of Korean Patent Application No. 10-2021-0160707 under 35 U.S.C. § 119, filed on Nov. 19, 2021, in the Korean Intellectual Property Office (KIPO), the entire contents of which are herein incorporated by reference.

BACKGROUND

1. Technical Field

The disclosure relates to a display apparatus capable of reducing the risk of defects in a manufacturing process.

2. Description of the Related Art

In general, a display apparatus is manufactured by forming a display element on a surface of a substrate and attaching a metal plate to another surface of the substrate. In order to attach the metal plate to the other surface of the substrate, an indentation portion is located on a side of the metal plate, and an alignment key is formed on the other surface to which the metal plate is attached. The metal plate is attached to the other surface of the substrate, by using the indentation portion and the alignment key.

SUMMARY

However, a conventional display apparatus has a problem in that defects may occur due to external light introduced through an indentation portion in a manufacturing process.

One or more embodiments include a display apparatus capable of reducing the risk of defects in a manufacturing process, and a method of manufacturing the display apparatus. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display apparatus may include a metal plate including an indentation portion indented inward from a side of the metal plate, and a display panel located on the metal plate, wherein the display panel may include a substrate including a display area and a peripheral area surrounding at least part of the display area, a metal wiring located on the substrate, and including a first portion overlapping or adjacent to the indentation portion in a plan view, a gate driving part located on the substrate, overlapping the metal plate in a plan view, and located adjacent to the metal wiring, and a shielding portion located between the substrate and the metal wiring, and overlapping at least a part of the indentation portion in a plan view.

The metal wiring may further include a second portion extending from the first portion and overlapping the metal plate in a plan view, and the shielding portion overlaps the second portion in a plan view.

The metal wiring may extend along an outer side of the display area and may surround the at least part of the display area.

The display panel may further include a shielding layer located on the substrate, an inorganic insulating layer covering the shielding layer, a semiconductor layer located on the inorganic insulating layer, a gate insulating layer covering the semiconductor layer, and a gate layer located on the gate insulating layer.

The metal wiring may be located on the gate insulating layer.

The display panel may further include an interlayer insulating layer covering the gate layer, and a conductive layer located on the interlayer insulating layer, wherein the metal wiring may be located on the interlayer insulating layer.

The metal wiring and the conductive layer may include a same material.

The shielding portion and the shielding layer may be located on a same layer.

The shielding portion and the shielding layer may include a same material.

The display panel may further include a driving voltage wiring located between the indentation portion and the gate driving part in a plan view.

According to one or more embodiments, a display apparatus may include a metal plate including an opening portion on a side, and a display panel located on the metal plate, wherein the display panel may include a substrate including a display area and a peripheral area surrounding at least part of the display area, a metal wiring located on the substrate, and comprising a third portion overlapping or adjacent to the opening portion in a plan view, a gate driving part located on the substrate, overlapping the metal plate in a plan view, and located adjacent to the metal wiring, and a shielding portion located between the substrate and the metal wiring, and overlapping at least a part of the opening portion in a plan view.

The metal wiring may include a fourth portion extending from the third portion and overlapping the metal plate in a plan view, and the shielding portion overlaps the fourth portion in a plan view.

The metal wiring may extend along an outer side of the display area and may surround the at least part of the display area.

The display panel may further include a shielding layer located on the substrate, an inorganic insulating layer covering the shielding layer, a semiconductor layer located on the inorganic insulating layer, a gate insulating layer covering the semiconductor layer, and a gate layer located on the gate insulating layer.

The metal wiring may be located on the gate insulating layer.

The display panel may further include an interlayer insulating layer covering the gate layer, and a conductive layer located on the interlayer insulating layer, wherein the metal wiring may be located on the interlayer insulating layer.

The shielding portion and the shielding layer may be located on a same layer.

The shielding portion and the shielding layer may include a same material.

The display panel may further include a driving voltage wiring located between the opening portion and the gate driving part in a plan view.

Other aspects, features, and advantages of the disclosure will become more apparent from the detailed description, the claims, and the drawings.

BRIEF DESCRIPTION OF THE DRAWINGS

The above and other aspects, features, and advantages of certain embodiments will be more apparent from the following description taken in conjunction with the accompanying drawings, in which:

FIG. 6 is a bottom view illustrating a display apparatus according to an embodiment;

FIG. 20 is a view illustrating portion A of FIG. 2; and

FIG. 21 is a schematic cross-sectional view taken along line III-III' of FIG. 20.

DETAILED DESCRIPTION OF THE EMBODIMENTS

Figure 1:
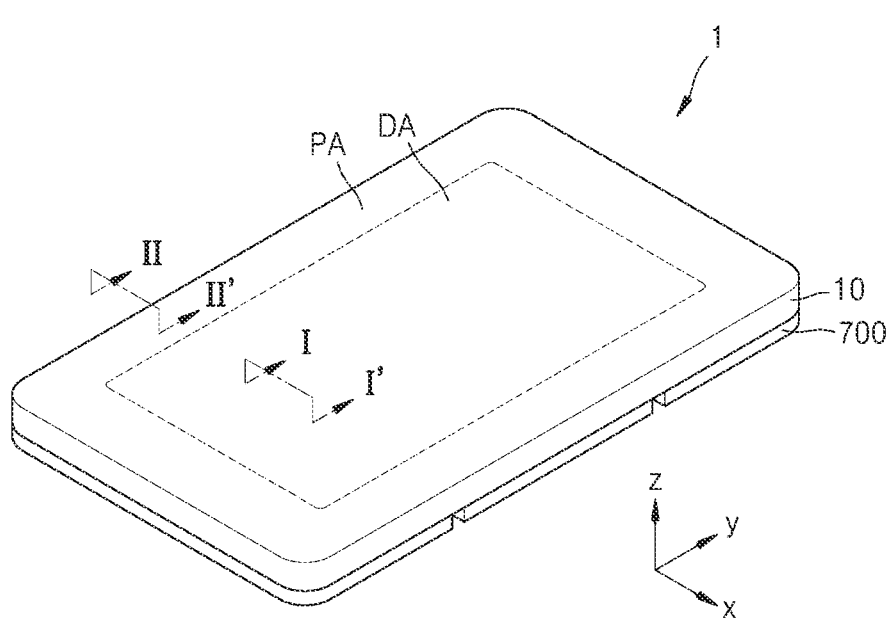
FIG. 1 is a perspective view illustrating a portion of a display apparatus, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

It will be understood that when a component, such as a layer, a film, a region, or a plate, is referred to as being "on" another component, the component may be directly on the other component or intervening components may be present therebetween. Sizes of components in the drawings may be exaggerated or contracted for convenience of explanation. For example, because sizes and thicknesses of elements in the drawings are arbitrarily illustrated for convenience of explanation, the disclosure is not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Although the terms "first," "second," etc. may be used to describe various elements, these elements should not be limited by these terms. These terms are only used to distinguish one element from another.

As used herein, the singular forms "a", "an", and "the" are intended to include the plural forms as well, unless the context clearly indicates otherwise.

It will be further understood that the terms "comprises" or "comprising" used herein specify the presence of stated features or components, but do not preclude the presence or addition of one or more other features or components.

"A and/or B" is used herein to select only A, select only B, or select both A and B. "At least one of A and B" is used to select only A, select only B, or select both A and B.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween. Also, when an element is referred to as being "in contact" or "contacted" or the like to another element, the element may be in "electrical contact" or in "physical contact" with another element; or in "indirect contact" or in "direct contact" with another element.

FIG. 1 is a perspective view illustrating a portion of a display apparatus 1, according to an embodiment. As shown in FIG. 1, the display apparatus 1 according to the embodiment may include a display panel 10 and a metal plate 700 supporting the display panel 10. The display apparatus 1 may be any device as long as it includes a display panel 10. For example, the display apparatus 1 may be any of various products such as a smartphone, a tablet, a laptop, a television, or a billboard.

The display panel 10 may include a substrate 100 (see FIG. 2) including a display area DA and a peripheral area PA outside of the display area DA. The display area DA may be a portion where an image is displayed, and multiple pixels may be located in the display area DA. In case that viewed in a direction (z axis direction) substantially perpendicular to the display panel 10, the display area DA may have any of various shapes such as a circular shape, an elliptical shape, a polygonal shape, or a shape of a specific figure. In FIG. 1, the display area DA has a substantially rectangular shape with rounded corners.

The peripheral area PA may be located outside of the display area DA. The peripheral area PA may be a portion where an image is not displayed, and may entirely or partially surround the display area DA. A driving unit or the like for providing an electrical signal or power to a pixel circuit corresponding to each of the multiple pixels may be located in the peripheral area PA. A pad to which an electronic device, a printed circuit board, or the like may be electrically connected may be located in the peripheral area PA.

The metal plate 700 may be located under the display panel 10, and may support the display panel 10. The metal plate 700 may be a plate formed of a metal material. For example, the metal plate 700 may include a metal, or an alloy of at least two metals. For example, the metal plate 700 may include aluminum (Al), copper (Cu), iron (Fe), or chromium (Cr). However, the disclosure is not limited thereto. An adhesive layer may be located between the metal plate 700 and the display panel 10. The adhesive layer may bind the metal plate 700 to the display panel 10.

Figure 2:
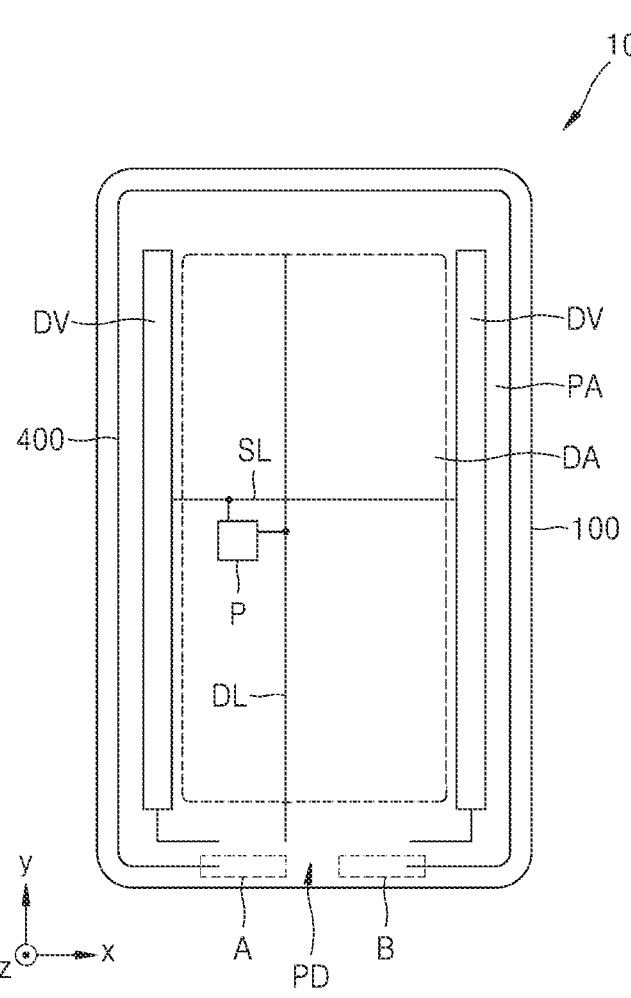
FIG. 2 is a plan view illustrating a portion of a display panel of a display apparatus, according to an embodiment.
Figure 3:
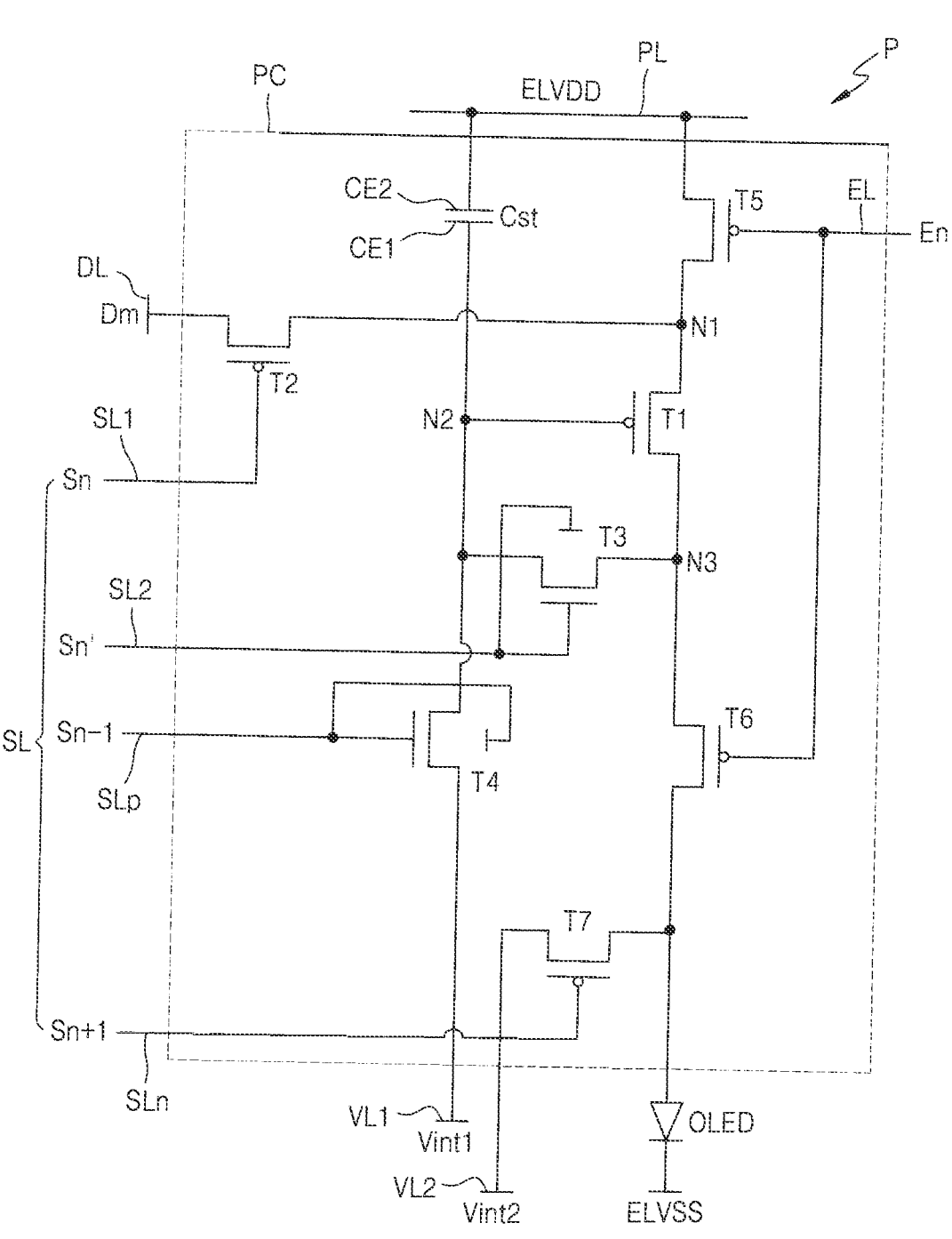
FIG. 3 is a schematic diagram of an equivalent circuit of a pixel included in the display panel of FIG. 2.

FIG. 2 is a plan view illustrating a portion of the display panel 10 of the display apparatus 1, according to an embodiment. FIG. 3 is a schematic diagram of an equivalent circuit of a pixel P included in the display panel 10 of FIG. 2. In detail, FIG. 2 is a plan view illustrating the display panel 10 viewed from the top (+z direction).

As described above, the display panel 10 may include a substrate 100. The substrate 100 may include various materials that are flexible or bendable. For example, the substrate 100 may include glass, a metal, or a polymer resin. Also, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the substrate 100 may have a multi-layer structure with two polymer resin layers and a barrier layer including an inorganic material (e.g., silicon oxide, silicon nitride, or silicon oxynitride) located between the two polymer resin layers.

As shown in FIG. 2, the pixel P may be located in the display area DA of the substrate 100. The pixel P may refer to a sub-pixel, and may include a display element 280 (see FIG. 8) such as an organic light-emitting diode OLED. The pixel P may emit, for example, red light, green light, blue light, or white light.

The pixel P may be electrically connected to internal circuits located in the peripheral area PA. A gate driving unit (or gate driving part) DV and a pad unit PD may be located in the peripheral area PA.

The gate driving unit DV may provide signals to the pixel P through a signal wiring SL. In detail, the gate driving unit DV may be electrically connected to the signal wiring SL. The signal wiring SL may extend in a first direction (x axis direction) and may be electrically connected to the pixel P, and thus, the gate driving unit DV may provide signals such as a scan signal or a light-emitting control signal to the pixel P. The gate driving units DV may be located on both sides of the display area DA. Some of the pixels P located in the display area DA may be electrically connected to the left gate driving unit DA, and the rest may be electrically connected to the right gate driving unit DV. Although the gate driving units DV are located on both sides of the display area DA in FIG. 2, the disclosure is not limited thereto. For example, the gate driving unit DV may be located only on a side of the display area DA.

The pad unit PD may be electrically connected to a controller (not shown), and may provide a signal or a voltage to the gate driving unit DV. In detail, a terminal of the pad unit PD may be exposed without being covered by an insulating layer and may be electrically connected to a terminal of a printed circuit board 360 (see FIG. 21). The printed circuit board 360 may transmit a signal or power of the controller to the display panel 10. For example, a control signal generated by the controller may be transmitted to the gate driving unit DV through the printed circuit board 360. Also, the controller may transmit a driving voltage ELVDD to a driving voltage wiring PL and may provide a common voltage ELVSS to an electrode power supply wiring. The common voltage ELVSS may be transmitted to a counter electrode 283 (see FIG. 8) of the pixel P through the electrode power supply wiring.

A data driving unit (not shown) may generate a data signal, and the generated data signal may be transmitted to the pixel P through a data wiring DL. The data wiring DL crosses the display area DA and extends to the peripheral area PA. A data signal from the data driving unit may be applied to the data wiring DL through the pad unit PD.

A metal wiring 400 may be located in the peripheral area PA of the substrate 100. In detail, the metal wiring 400 may surround at least a part of the display area DA, and may be located outside the gate driving unit DV. The metal wiring 400 may be used to determine whether a crack occurs in the display panel. A detailed description of the metal wiring 400 will be described below.

As shown in FIG. 3, one pixel P may include a pixel circuit PC and an organic light-emitting diode OLED electrically connected to the pixel circuit PC.

The pixel circuit PC may include multiple thin-film transistors (e.g., T1 through T7) and a storage capacitor Cst as shown in FIG. 3. The multiple thin-film transistors (e.g., T1 through T7) and the storage capacitor Cst may be electrically connected to signal wirings (e.g., SL1, SL2, SLp, SLn, EL, and DL), a first initialization voltage wiring VL1, a second initialization voltage wiring VL2, and the driving voltage wiring PL. At least one of the wirings, for example, the driving voltage wiring PL, may be shared by neighboring pixels P.

The multiple thin-film transistors (e.g., T1 through T7) may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a first electrode (e.g., a pixel electrode) and a second electrode (e.g., a counter electrode), and the first electrode of the organic light-emitting diode OLED may be electrically connected to the driving transistor T1 via the emission control transistor T6 and may receive driving current and the second electrode of the organic light-emitting diode OLED may receive the common voltage ELVSS. The organic light-emitting diode OLED may generate light having a luminance corresponding to the driving current.

Some of the multiple thin-film transistors (e.g., T1 through T7) may be provided as n-channel MOSFETs (NMOSs) and the rest may be provided as p-channel MOSFETs (PMOSs). For example, the compensation transistor T3 and the first initialization transistor T4 among the multiple thin-film transistors (e.g., T1 through T7) may be NMOSs and the rest may be PMOSs. In another example, the compensation transistor T3, the first initialization transistor T4, and the second initialization transistor T7 among the multiple thin-film transistors (e.g., T1 through T7) may be NMOSs and the rest may be PMOSs. In another example, all of the multiple thin-film transistors (e.g., T1 through T7) may be NMOSs or PMOSs. The multiple thin-film transistors (e.g., T1 through T7) may include amorphous silicon or polysilicon. In case that it is necessary, a thin-film transistor that is an NMOS may include an oxide semiconductor. For convenience, the following will be described assuming that the compensation transistor T3 and the first initialization transistor T4 are NMOSs including an oxide semiconductor and the rest are PMOSs.

The signal wirings may include a first scan wiring SL1 that transmits a first scan signal Sn, a second scan wiring SL2 that transmits a second scan signal Sn', a previous scan wiring SLp that transmits a previous scan signal Sn−1 to the first initialization transistor T4, a next scan wiring SLn that transmits a next scan signal Sn+1 to the second initialization transistor T7, an emission control wiring EL that transmits an emission control signal En to the operation control transistor T5 and the emission control transistor T6, and the data wiring DL crossing the first scan wiring SL1 and transmitting a data signal Dm.

The driving voltage wiring PL may transmit the driving voltage ELVDD to the driving transistor T1, the first initialization voltage wiring VL1 may transmit a first initialization voltage Vint1 for initializing the driving transistor T1, and the second initialization voltage wiring VL2 may transmit a second initialization voltage Vint2 for initializing the first electrode of the organic light-emitting diode OLED.

A driving gate electrode of the driving transistor T1 may be electrically connected to the storage capacitor Cst through a second node N2, any one of a source region and a drain region of the driving transistor T1 may be electrically connected to the driving voltage wiring PL via the operation control transistor T5 through a first node N1, and the other of the source region and the drain region of the driving transistor T1 may be electrically connected to the first electrode (pixel electrode) of the organic light-emitting diode OLED via the emission control transistor T6 through a third node N3. The driving transistor T1 may receive the data signal Dm according to a switching operation of the switching transistor T2 and may supply driving current to the organic light-emitting diode OLED. For example, the driving transistor T1 may control the amount of current flowing from the first node N1 electrically connected to the driving voltage wiring PL to the organic light-emitting diode OLED, in response to a voltage applied to the second node N2 which varies according to the data signal Dm.

A switching gate electrode of the switching transistor T2 may be electrically connected to the first scan wiring SL1 that transmits the first scan signal Sn, any one of a source region and a drain region of the switching transistor T2 may be electrically connected to the data wiring DL, and the other of the source region and the drain region of the switching transistor T2 may be electrically connected to the driving transistor T1 through the first node N1 and may be electrically connected to the driving voltage wiring PL via the operation control transistor T5. The switching transistor T2 may transmit the data signal Dm from the data wiring DL to the first node N1, in response to a voltage applied to the first scan wiring SL1. For example, the switching transistor T2 may be turned on according to the first scan signal Sn received from the first scan wiring SL1, and may perform a switching operation of transmitting the data signal Dm transmitted through the data wiring DL to the driving transistor T1 from the first node N1.

A compensation gate electrode of the compensation transistor T3 may be electrically connected to the second scan wiring SL2. One of a source region and a drain region of the compensation transistor T3 may be electrically connected to the first electrode of the organic light-emitting diode OLED via the emission control transistor T6 through the third node N3. The other of the source region and the drain region of the compensation transistor T3 may be electrically connected to a first capacitor electrode CE1 of the storage capacitor Cst and the driving gate electrode of the driving transistor T1 through the second node N2. The compensation transistor T3 may be turned on according to the second scan signal Sn' received from the second scan wiring SL2 and may diode-connect the driving transistor T1.

A first initialization gate electrode of the first initialization transistor T4 may be electrically connected to the previous scan wiring SLp. One of a source region and a drain region of the first initialization transistor T4 may be electrically connected to the first initialization voltage wiring VL1. The other of the source region and the drain region of the first initialization transistor T4 may be electrically connected to the first capacitor electrode CE1 of the storage capacitor Cst and the driving gate electrode of the driving transistor T1 through the second node N2. The first initialization transistor T4 may apply the first initialization voltage Vint1 from the first initialization voltage wiring VL1 to the second node N2, in response to a voltage applied to the previous scan wiring SLp. For example, the first initialization transistor T4 may be turned on according to the previous scan signal Sn−1 received from the previous scan wiring SLp, and may perform an initialization operation of initializing a voltage of the driving gate electrode of the driving transistor T1 by transmitting the first initialization voltage Vint1 to the driving gate electrode of the driving transistor T1.

An operation control gate electrode of the operation control transistor T5 may be electrically connected to the emission control wiring EL, one of a source region and a drain region of the operation control transistor T5 may be electrically connected to the driving voltage wiring PL, and the other of the source region and the drain region of the operation control transistor T5 may be electrically connected to the driving transistor T1 and the switching transistor T2 through the first node N1.

An emission control gate electrode of the emission control transistor T6 may be electrically connected to the emission control wiring EL, one of a source region and a drain region of the emission control transistor T6 may be electrically connected to the driving transistor T1 and the compensation transistor T3 through the third node N3, and the other of the source region and the drain region of the emission control transistor T6 may be electrically connected to the first electrode (pixel electrode) of the organic light-emitting diode OLED.

The operation control transistor T5 and the emission control transistor T6 may be simultaneously turned on according to the emission control signal En received from the emission control wiring EL, so that the driving voltage ELVDD is transmitted to the organic light-emitting diode OLED and the driving current flows through the organic light-emitting diode OLED.

A second initialization gate electrode of the second initialization transistor T7 may be electrically connected to the next scan wiring SLn, one of a source region and a drain region of the second initialization transistor T7 may be electrically connected to the first electrode (pixel electrode) of the organic light-emitting diode OLED, and the other of the source region and the drain region of the second initialization transistor T7 may be electrically connected to the second initialization voltage wiring VL2 and may receive the second initialization voltage Vint2. The second initialization transistor T7 may be turned on according to the next scan signal Sn+1 received from the next scan wiring SLn, and may initialize the first electrode (pixel electrode) of the organic light-emitting diode OLED. The next scan wiring SLn may be the same as the first scan wiring SL1. The scan wiring may function as the first scan wiring SL1 or may function as the next scan wiring SLn, by transmitting the same electrical signal with a time difference. For example, the next scan wiring SLn may be a first scan wiring of a pixel that is adjacent to the pixel P of FIG. 3 and may be electrically connected to the data wiring DL.

The second initialization transistor T7 may be electrically connected to the next scan wiring SLn as shown in FIG. 3. However, the disclosure is not limited thereto, and the second initialization transistor T7 may be electrically connected to the emission control wiring EL and may be driven according to the emission control signal En.

The storage capacitor Cst may include a first capacitor electrode CE1 and a second capacitor electrode CE2. The first capacitor electrode CE1 of the storage capacitor Cst may be electrically connected to the driving gate electrode of the driving transistor T1 through the second node N2, and the second capacitor electrode CE2 of the storage capacitor Cst may be electrically connected to the driving voltage wiring PL. The storage capacitor Cst may store a charge corresponding to a difference between the driving gate electrode voltage of the driving transistor T1 and the driving voltage ELVDD.

A detailed operation of each pixel P according to an embodiment is as follows.

During an initialization period, in case that the previous scan signal Sn−1 is supplied through the previous scan wiring SLp, the first initialization transistor T4 may be turned on in response to the previous scan signal Sn−1, and the driving transistor T1 may be initialized by the first initialization voltage Vint1 supplied from the first initialization voltage wiring VL1.

During a data programming period, in case that the first scan signal Sn and the second scan signal Sn' are supplied through the first scan wiring SL1 and the second scan wiring SL2, the switching transistor T2 and the compensation transistor T3 may be turned on in response to the first scan signal Sn and the second scan signal Sn'. The driving transistor T1 may be diode-connected by the turned-on compensation transistor T3, and may be forward biased. A compensation voltage Dm+Vth (Vth is a negative (−) value) obtained by subtracting a threshold voltage Vth of the driving transistor T1 from the data signal Dm supplied from the data wiring DL may be applied to the driving gate electrode G1 of the driving transistor T1. The driving voltage ELVDD and the compensation voltage Dm+Vth may be applied to both ends of the storage capacitor Cst, and a charge corresponding to a voltage difference between both ends may be stored in the storage capacitor Cst.

During a light emission period, the operation control transistor T5 and the emission control transistor T6 may be turned on by the emission control signal En supplied from the emission control wiring EL. Driving current according to a voltage difference between a voltage of the driving gate electrode G1 of the driving transistor T1 and the driving voltage ELVDD may be generated, and the driving current may be supplied to the organic light-emitting diode OLED through the emission control transistor T6.

As described above, some of the multiple thin-film transistors (e.g., T1 through T7) may include an oxide semiconductor. For example, the compensation transistor T3 and the first initialization transistor T4 may include an oxide semiconductor.

Because polysilicon has high reliability, it may be controlled to flow intended current accurately. Accordingly, the driving transistor T1 which directly affects a luminance of a display apparatus may include a semiconductor layer including polysilicon having high reliability, and thus, a high-resolution display apparatus may be realized. Because an oxide semiconductor has high carrier mobility and low leakage current, voltage drop may not be large even in case that a driving time is long. For example, in the case of an oxide semiconductor, because a color change in an image due to voltage drop may not be large even during low-frequency driving, low-frequency driving may be possible. Accordingly, the compensation transistor T3 and the first initialization transistor T4 may include an oxide semiconductor, and thus, leakage current may be prevented and the display apparatus 1 with reduced power consumption may be realized.

Because an oxide semiconductor is sensitive to light, the amount of current may be changed by external light. Accordingly, the external light may be absorbed or reflected by locating a metal layer under the oxide semiconductor. Accordingly, as shown in FIG. 3, in each of the compensation transistor T3 and the first initialization transistor T4 including an oxide semiconductor, gate electrodes may be located over and under an oxide semiconductor layer. For example, in case that it is viewed in a direction (z axis direction) perpendicular to the substrate 100, the metal layer located under the oxide semiconductor may overlap the oxide semiconductor.

Figure 4:
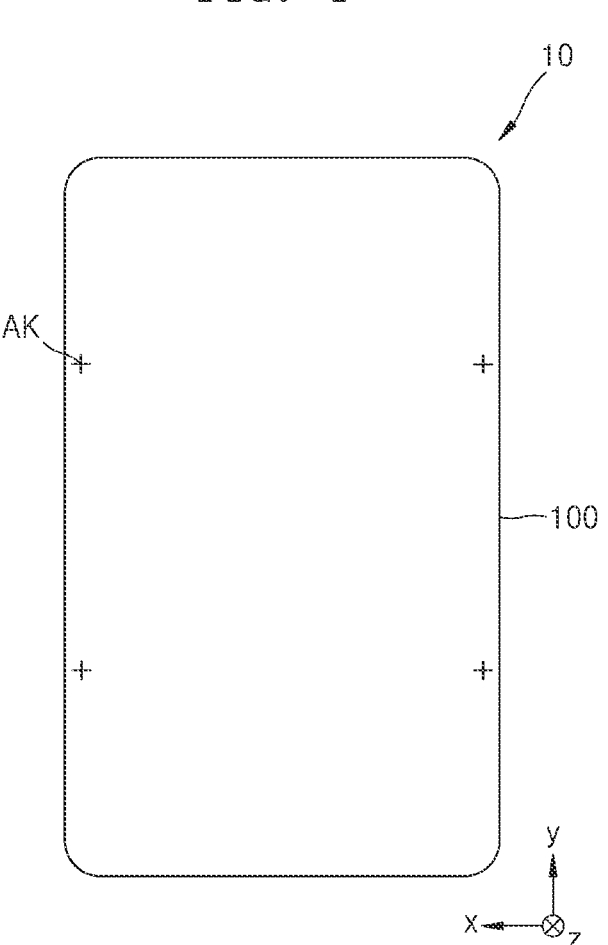
FIG. 4 is a bottom view illustrating a display panel of a display apparatus according to an embodiment.
Figure 5:
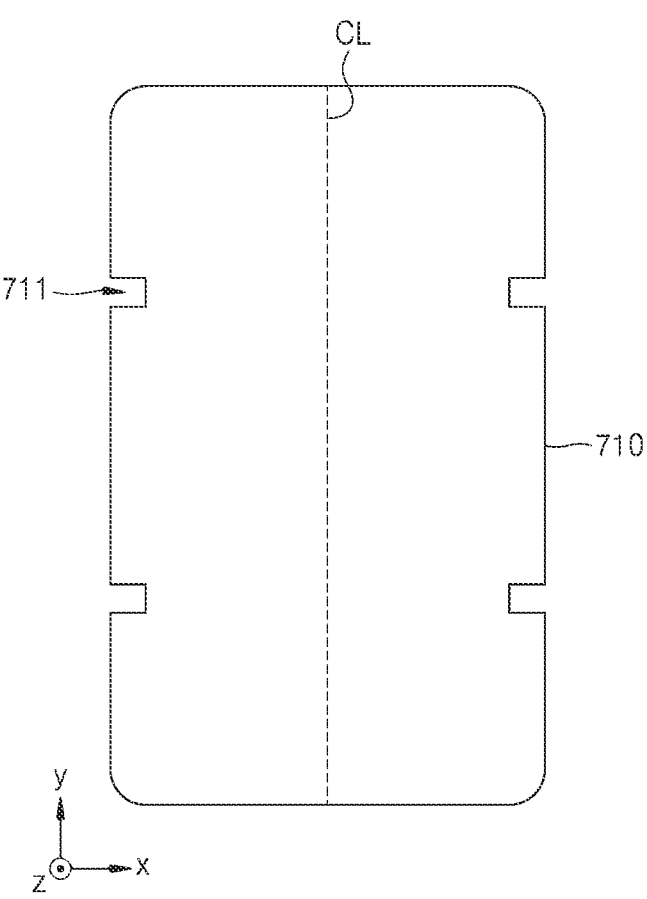
FIG. 5 is a plan view illustrating a first metal plate of a display apparatus according to an embodiment.

FIG. 4 is a bottom view (−z direction) illustrating the display panel 10 of the display 1 according to an embodiment. FIG. 5 is a plan view (+z direction) illustrating a first metal plate 710 of the display apparatus 1 according to an embodiment. The display panel 10 may include a (+z direction) top surface and a (−z direction) bottom surface. The metal plate 700 may include a first metal plate 710, and the first metal plate 710 may include a (+z direction) top surface and a (−z direction) bottom surface. As shown in FIG. 4, multiple alignment keys AK may be located on the (−z direction) bottom surface of the display panel 10. In case that the top surface of the first metal plate 710 is attached to the bottom surface of the display panel 10, the first metal plate 710 may be attached to a designated position of the display panel 10 by using the alignment keys AK. Although the multiple alignment keys AK provided in the display panel 10 may be formed on the (−z direction) bottom surface of the display panel 10, the disclosure is not limited thereto. For example, in case that a wiring or an electrode is formed by forming a metal layer on an entire surface of the substrate 100 and patterning the metal layer in a process of forming the display panel 10, the alignment keys AK as shown in FIG. 4 may be formed at the same time as the wiring or the electrode. This may apply to the following embodiments and modifications thereof.

As shown in FIG. 5, the first metal plate 710 may include multiple indentation portions 711. The term "indentation portion" used herein may refer to a portion that is concavely indented inward from a side of the first metal plate 710.

The indentation portions 711 may be indented inward from a side of the first metal plate 710. For example, the indentation portion 711 may be formed on a side of the first metal plate 710, by cutting a part of the first metal plate 710 by using a laser beam. Some of the indentation portions 711 may be located on a side of the first metal plate 710, and the rest of the indentation portions 711 may be located on another side. In detail, the indentation portions 711 may be symmetrically arranged about a central line CL of the first metal plate 710 or may be arranged with a similar separation distance. The display panel 10 and the first metal plate 710 may be located so that the multiple alignment keys AK respectively correspond to the multiple indentation portions 711, and thus, the first metal plate 710 may be attached to a designated position of the display panel 10.

Figure 6:
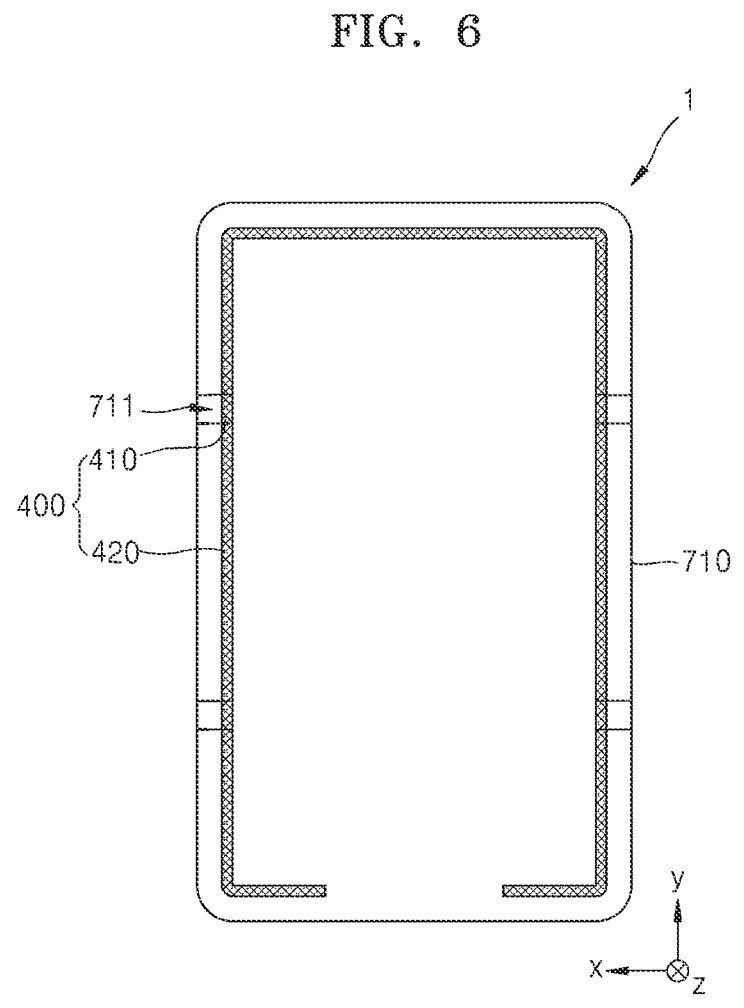
Figure 7:
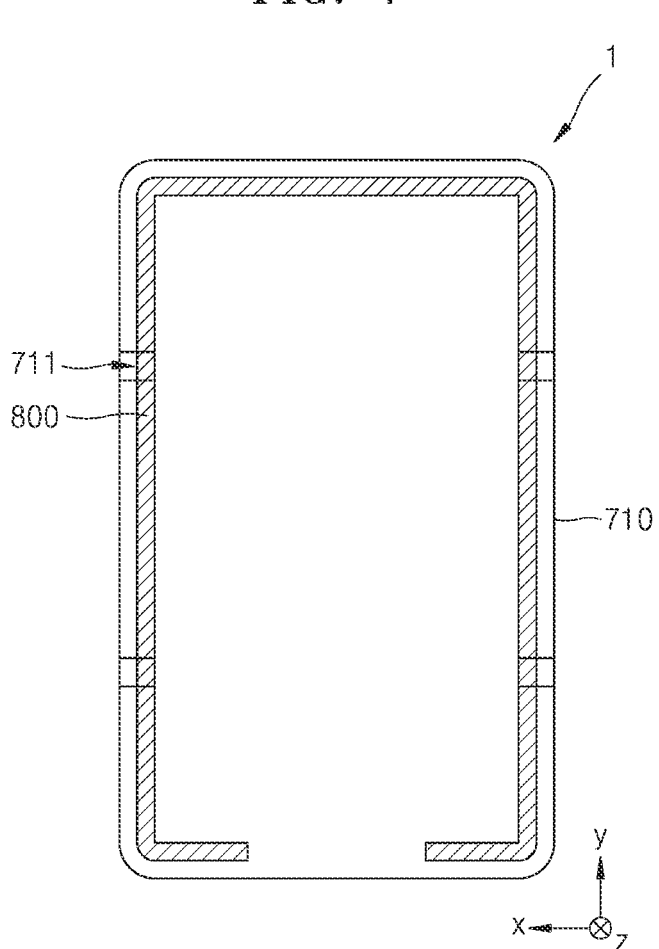
FIG. 7 is a bottom view illustrating a display apparatus according to an embodiment.

FIGS. 6 and 7 are bottom views (−z direction) illustrating the display apparatus 1 according to an embodiment. For convenience of explanation, the metal wiring 400 is also illustrated in FIG. 6. As shown in FIG. 6, in case that the (+z direction) top surface of the first metal plate 710 is attached to the (−z direction) bottom surface of the display panel 10, a part of the metal wiring 400 of the display panel 10 may overlap the indentation portion 711 of the first metal plate 710. In detail, the metal wiring 400 may include a first portion 410 overlapping the indentation portion 711 in case that it is viewed in the direction (z axis direction) perpendicular to the substrate 100, and a second portion 420 extending from the first portion 410 and overlapping the first metal plate 710 in case that it is viewed in the direction (z axis direction) perpendicular to the substrate 100.

The metal wiring 400 may be shielded by a shielding portion 800. For convenience of explanation, the shielding portion 800 is also illustrated in FIG. 7. As shown in FIG. 7, in case that the (−z direction) bottom surface of the display panel 10 is attached to the (+z direction) top surface of the first metal plate 710, a part of the shielding portion 800 of the display panel 10 may overlap the indentation portion 711 of the first metal plate 710. In detail, a portion of the shielding portion 800 overlapping the indentation portion 711 may overlap the first portion 410 of the metal wiring 400. Also, the remaining portion of the shielding portion 800 may overlap the second portion 420 of the metal wiring 400. Accordingly, the metal wiring 400 may be shielded by the shielding portion 800. Although the shielding portion 800 overlaps the first portion 410 and the second portion 420 in FIG. 6, the disclosure is not limited thereto. For example, the shielding portion 800 may overlap only the first portion 410.

The first portion 410 of the metal wiring 400 may be located adjacent to the indentation portion 711, in case that it is viewed in the direction (z axis direction) perpendicular to the substrate 100. The metal wiring 400 may include the second portion 420 extending from the first portion 410 and overlapping the first metal plate 710 in case that it is viewed in the direction (z axis direction) perpendicular to the substrate 100. A part of the shielding portion 800 may overlap the indentation portion 711, and the remaining portion of the shielding portion 800 may overlap the second portion 420 of the metal wiring 400.

Figure 8:
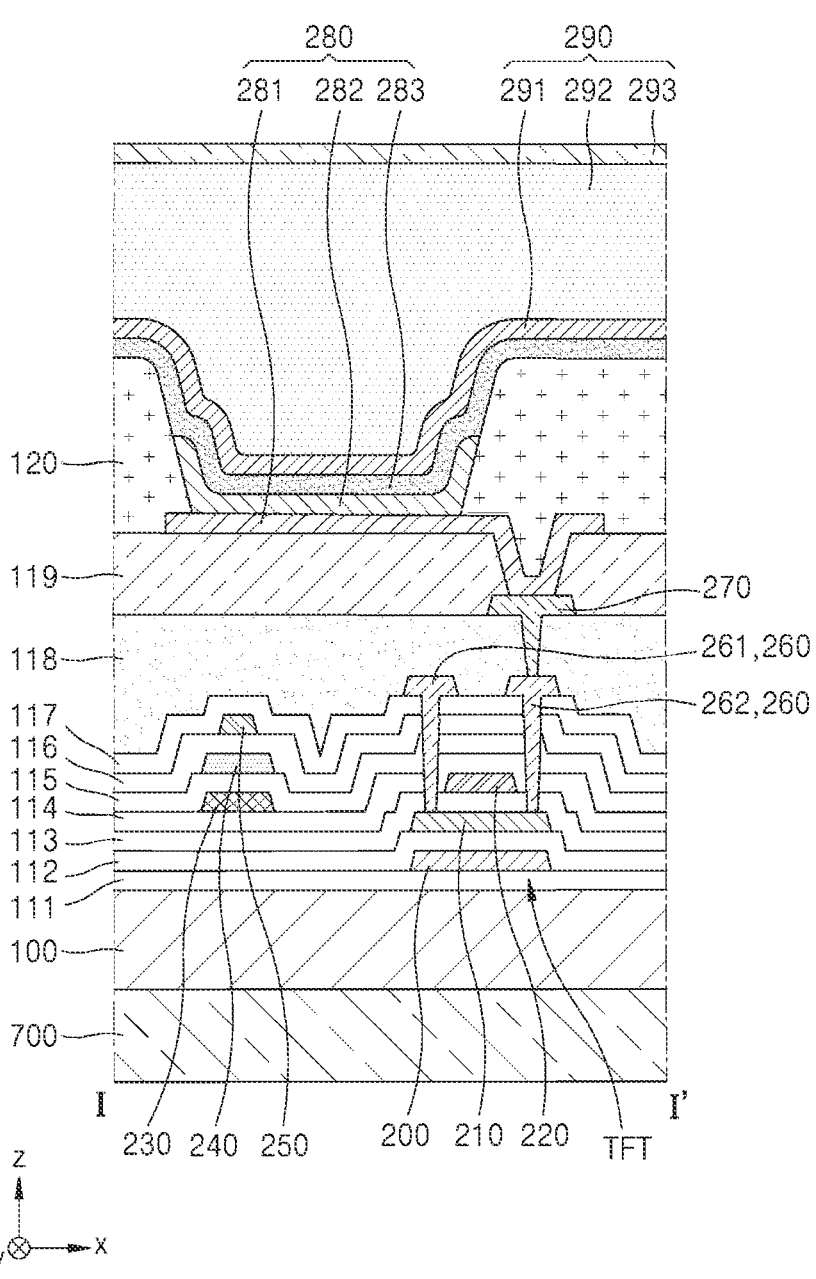
FIG. 8 is a schematic cross-sectional view taken along line I-I' of FIG. 1.

FIG. 8 is a schematic cross-sectional view in the display area DA, taken along line I-I' of FIG. 1. As shown in FIG. 8, the display panel 10 may be located on the metal plate 700. A buffer layer 111 including silicon oxide, silicon nitride, or silicon oxynitride may be formed on the substrate 100 of the display panel 10. The buffer layer 111 may increase flatness of a top surface of the substrate 100, and may prevent metal atoms or impurities from being diffused from the substrate 100 to a first semiconductor layer 210 located on the buffer layer 111. The buffer layer 111 may have a single or multi-layer structure including silicon oxide, silicon nitride, or silicon oxynitride.

A transistor TFT may be formed on the buffer layer 111. As shown in FIG. 8, the transistor TFT may include a shielding layer 200, the first semiconductor layer 210, a first gate layer 220, a conductive layer 230, a second semiconductor layer 240, and a second gate layer 250.

The shielding layer 200 may be located on the buffer layer 111. The shielding layer 200 may have a shape corresponding to the driving transistor T1, and may function as a lower protective metal for protecting the first conductive layer 210. The shielding layer 200 may include a metal, an alloy, a conductive metal oxide, or a transparent conductive material. For example, the shielding layer 200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The shielding layer 200 may have a multi-layer structure. For example, the shielding layer 200 may have a two-layer structure including Mo/Al or a three-layer structure including Mo/Al/Mo. An inorganic insulating layer 112 may cover the shielding layer 200, and may be located on the buffer layer 111. The inorganic insulating layer 112 may include an insulating material. For example, the inorganic insulating layer 112 may include silicon oxide, silicon nitride, silicon oxynitride, or aluminum oxide.

The first semiconductor layer 210 may be located on the inorganic insulating layer 112. The first semiconductor layer 210 may include a silicon semiconductor. For example, the first semiconductor layer 210 may include amorphous silicon or polysilicon. In detail, the first semiconductor layer 210 may include polysilicon crystalized at a low temperature. In case that it is necessary, ions may be implanted into at least a part of the first semiconductor layer 210. A first gate insulating layer 113 may cover the first semiconductor layer 210, and may be located on the inorganic insulating layer 112. The first gate insulating layer 113 may be an inorganic insulating layer including an inorganic material such as silicon oxide, silicon nitride, and/or silicon oxynitride.

The first gate layer 220 may be located on the first gate insulating layer 113. The first gate layer 220 may include a metal, an alloy, a conductive metal oxide, or a transparent conductive material. For example, the first gate layer 220 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The first gate layer 220 may have a multi-layer structure. For example, the first gate layer 220 may have a two-layer structure including Mo/Al or a three-layer structure including Mo/Al/Mo. A first interlayer insulating layer 114 may cover the first gate layer 220. The first interlayer insulating layer 114 may be an inorganic insulating layer including an inorganic material such as silicon oxide, silicon nitride, and/or silicon oxynitride.

The conductive layer 230 may be located on the first interlayer insulating layer 114. The conductive layer 230 may include a metal, an alloy, a conductive metal oxide, or a transparent conductive material. For example, the conductive layer 230 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The conductive layer 230 may have a multi-layer structure. For example, the conductive layer 230 may have a two-layer structure including Mo/Al or a three-layer structure including Mo/Al/Mo. A second interlayer insulating layer 115 may cover the conductive layer 230. The second interlayer insulating layer 115 may be an inorganic insulating layer including an inorganic material such as silicon oxide, silicon nitride, and/or silicon oxynitride.

The second semiconductor layer 240 may be located on the second interlayer insulating layer 115. The second semiconductor layer 240 may include an oxide semiconductor. A second gate insulating layer 116 may cover the second semiconductor layer 240. The second gate insulating layer 116 may be an inorganic insulating layer including an inorganic material such as silicon oxide, silicon nitride, and/or silicon oxynitride.

The second gate layer 250 may be located on the second gate insulating layer 116. The second gate layer 250 may include a metal, an alloy, a conductive metal oxide, or a transparent conductive material. For example, the second gate layer 250 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The second gate layer 250 may have a multi-layer structure. For example, the second gate layer 250 may have a two-layer structure including Mo/Al or may have a three-layer structure including Mo/Al/Mo. A third interlayer insulating layer 117 may cover the second gate layer 250. The third interlayer insulating layer 117 may be an inorganic insulating layer including an inorganic material such as silicon oxide, silicon nitride, and/or silicon oxynitride.

A first connection electrode layer 260 including a source electrode 261 and a drain electrode 262 may be located on the third interlayer insulating layer 117. The first connection electrode layer 260 may include a metal, an alloy, a conductive metal oxide, or a transparent conductive material. For example, the first connection electrode layer 260 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The first connection electrode layer 260 may have a multi-layer structure. For example, the first connection electrode layer 260 may have a two-layer structure including Ti/Al or may have a three-layer structure including Ti/Al/Ti.

A first planarization layer 118 may cover the first connection electrode layer 260. The first planarization layer 118 may include an organic insulating material. For example, the first planarization layer 118 may include photoresist, benzocyclobutene (BCB), polyimide, hexamethyldisiloxane (HMDSO), polymethylmethacrylate (PMMA), polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

A second connection electrode layer 270 may be located on the first planarization layer 118. The second connection electrode layer 270 may include a metal, an alloy, a conductive metal oxide, or a transparent conductive material. For example, the second connection electrode layer 270 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The second connection electrode layer 270 may have a multi-layer structure. For example, the second connection electrode layer 270 may have a two-layer structure including Ti/Al or may have a three-layer structure including Ti/Al/Ti.

A second planarization layer 119 may cover the second connection electrode layer 270. The second planarization layer 119 may include an organic insulating material. For example, the second planarization layer 119 may include photoresist, BCB, polyimide, HMDSO, PMMA, PS, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

In the display areas DA, the display element 280 including a pixel electrode 281, a counter electrode 283, and an intermediate layer 282 located between the pixel electrode 281 and the counter electrode 283 may be located on the second planarization layer 119. The pixel electrode 281 may be electrically connected to the transistor TFT by contacting any one of the source electrode 261 and the drain electrode 262 through the first connection electrode layer 260 and the second connection electrode layer 270 as shown in FIG. 8.

A pixel-defining film 120 may be located on the second planarization layer 119. The pixel-defining film 120 may define a pixel by having an opening corresponding to each sub-pixel, for example, an opening through which at least a portion of the pixel electrode 281 is exposed. Also, the pixel-defining film 120 may increase a distance between the pixel electrode 281 and the counter electrode 283 located over the pixel electrode 281, to prevent an arc or the like from occurring on the pixel electrode 281. The pixel-defining film 120 may be formed of an organic material such as polyimide or HMDSO.

The intermediate layer 282 of the organic light-emitting device OLED may include a low molecular weight material or a high molecular weight material. In case that the intermediate layer 282 includes a low molecular weight material, the intermediate layer 282 may have a single or stacked structure in which a hole injection layer (HIL), a hole transport layer (HTL), an emission layer (EML), an electron transport layer (ETL), and an electron injection layer (EIL) are stacked, and examples of the low molecular weight organic material may include various organic materials such as copper phthalocyanine (CuPc), N,N'-Di(napthalene-1-yl)-N,N'-diphenyl-benzidine (NPB), and tris-8-hydroxyquinoline aluminum (Alq3). The intermediate layer 282 with a low molecular weight material may be formed by using vacuum deposition.

In case that the intermediate layer 282 includes a high molecular weight material, the intermediate layer 282 may have a structure including an HTL and an EML. The HTL may include poly(3,4-ethylenedioxythiophene) (PEDOT), and the EML may include a polymer material such as a polyphenylene vinylene (PPV)-based material or a polyfluorene-based material. The intermediate layer 282 including a high molecular weight material may be formed by using screen printing, inkjet printing, laser-induced thermal imaging (LITI), or the like.

The intermediate layer 282 is not necessarily limited thereto, and may have any of various structures. The intermediate layer 282 may include a layer that is integrally formed over multiple pixel electrodes 281, or may include a layer that is patterned to correspond to each of the multiple pixel electrodes 281.

The counter electrode 283 may be located in the display area DA, and may cover the display area DA as shown in FIG. 8. For example, the counter electrode 283 may be integrally formed with multiple organic light-emitting devices and may correspond to the multiple pixel electrodes 281.

Because the organic light-emitting devices may be readily damaged by external moisture or oxygen, an encapsulation layer 290 may cover and protect the organic light-emitting devices. The encapsulation layer 290 may cover the display area DA and may extend to the outside of the display area DA. The encapsulation layer 290 may include a first inorganic encapsulation layer 291, an organic encapsulation layer 292, and a second inorganic encapsulation layer 293 as shown in FIG. 8.

The first encapsulation layer 291 may cover the counter electrode 283, and may include silicon oxide, silicon nitride, and/or silicon oxynitride. In case that it is necessary, other layers such as a capping layer may be located between the first inorganic encapsulation layer 291 and the counter electrode 283. Because the first inorganic encapsulation layer 291 may be formed along a lower structure, a top surface of the first inorganic encapsulation layer 291 may be not flat as shown in FIG. 8. The organic encapsulation layer 292 may cover the first inorganic encapsulation layer 291 to have a substantially flat top surface, unlike the first inorganic encapsulation layer 291. In detail, a portion of the organic encapsulation layer 292 corresponding to the display area DA may have a substantially flat top surface. The organic encapsulation layer 292 may include at least one material selected from the group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 293 may cover the organic encapsulation layer 292, and may include silicon oxide, silicon nitride, and/or silicon oxynitride. The second inorganic encapsulation layer 293 may prevent the organic encapsulation layer 292 from being exposed to the outside, by contacting the first inorganic encapsulation layer 291 at an edge located outside the display area DA.

As such, because the encapsulation layer 290 may include the first inorganic encapsulation layer 291, the organic encapsulation layer 292, and the second inorganic encapsulation layer 293, even in case that cracks occurred in the encapsulation layer 290, due to this multi-layer structure, the cracks may not be connected between the first inorganic encapsulation layer 291 and the organic encapsulation layer 292 or between the organic encapsulation layer 292 and the second inorganic encapsulation layer 293. Accordingly, formation of a path through which external moisture or oxygen penetrates into the display area DA may be prevented or minimized.

Figure 9:
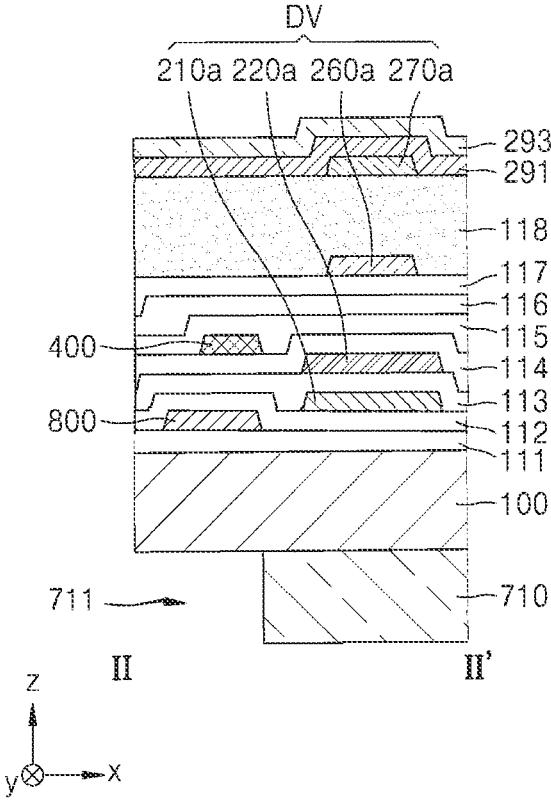
FIG. 9 is a schematic cross-sectional view taken along line II-II' of FIG. 1.

FIG. 9 is a schematic cross-sectional view taken along line II-II of FIG. 1. As shown in FIG. 9, the metal wiring 400 and the gate driving unit DV may be located in the peripheral area PA. The shielding portion 800 may be located under the metal wiring 400.

As described above, the metal wiring 400 may overlap the indentation portion 711 of the first metal plate 710, in case that it is viewed in the direction (z axis direction) perpendicular to the substrate 100. Also, the metal wiring 400 may be located on the same layer as that of the conductive layer 230 included in the transistor TFT. For example, the metal wiring 400 may be located on the first interlayer insulating layer 114. The metal wiring 400 and the conductive layer 230 included in the transistor TFT may be simultaneously formed by using the same material. Accordingly, the metal wiring 400 and the conductive layer 230 may include the same material.

The gate driving unit DV may overlap the first metal plate 710, in case that it is viewed in the direction (z axis direction) perpendicular to the substrate 100. Also, the gate driving unit DV may be located adjacent to the metal wiring 400. Although the gate driving unit DV may include electronic elements such as various transistors and/or a capacitor, only a part of one electrode or wiring which may be included in such electronic elements is illustrated in FIG. 9 for convenience. The gate driving unit DV may include, for example, a first layer 210a, a second layer 220a, a third layer 260a, and a fourth layer 270a.

The first layer 210a may be located on the inorganic insulating layer 112, and the second layer 220a may be located on the first gate insulating layer 113. The first layer 210a and the first semiconductor layer 210 included in the transistor TFT located in the display area DA may be simultaneously formed by using the same material. The second layer 220a and the first gate layer 220 included in the transistor TFT located in the display area DA may be simultaneously formed by using the same material. The third layer 260a may be located on the third interlayer insulating layer 117, and the fourth layer 270a may be located on the first planarization layer 118. The third layer 260a and the first connection electrode layer 260 included in the transistor TFT located in the display area DA may be simultaneously formed by using the same material. The fourth layer 270a and the second connection electrode layer 270 included in the transistor TFT located in the display area DA may be simultaneously formed by using the same material. As such, a transistor included in the gate driving unit DV and the transistor TFT located in the display area DA may be simultaneously formed by using the same material.

The shielding portion 800 may be located between the substrate 100 and the metal wiring 400. In detail, the shielding portion 800 may be located on the same layer as the shielding layer 200 included in the transistor TFT. For example, the shielding portion 800 may be located on the buffer layer 111. The shielding portion 800 and the shielding layer 200 included in the transistor TFT may be simultaneously formed by using the same material. Accordingly, the shielding portion 800 and the shielding layer 200 may include the same material. The shielding portion 800 may overlap at least a part of the indentation portion 711 of the first metal plate 710, in case that it is viewed in the direction (z axis direction) perpendicular to the substrate 100. In detail, because the shielding portion 800 may overlap the indentation portion 711 and the metal wiring 400 may overlap the indentation portion 711, the shielding portion 800 may be located under the metal wiring 400. Accordingly, the shielding portion 800 may shield the metal wiring

400 from external light introduced into the display panel 10, through the indentation portion 711 of the first metal plate 710.

Figure 10:
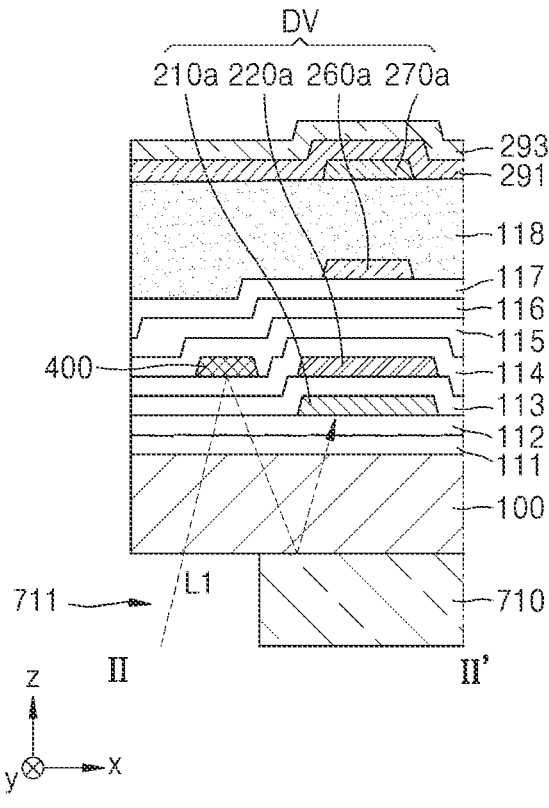
FIG. 10 is a schematic cross-sectional view for describing introduction of external light in a display apparatus according to a comparative example.

The light introduced through the indentation portion 711 of the first metal plate 710 may include light obliquely incident on a (–z direction) bottom surface of the shielding portion 800. As shown in FIG. 10 that is a schematic cross-sectional view for describing introduction of external light in a display apparatus according to a comparative example, in case that the shielding portion 800 is not located under the metal wiring 400, light L1 introduced through the indentation portion 711 of the first metal plate 710 may reach the gate driving unit DV. In detail, the light L1 obliquely incident on a (–z direction) bottom surface of the metal wiring 400 may be reflected by the (–z direction) bottom surface of the metal wiring 400 to change an optical path. The reflected light L1 may be obliquely incident on a (+z direction) top surface of the first metal plate 710, and is reflected by the (+z direction) top surface of the first metal plate 710, to change an optical path. The light L1 may reach the first layer 210*a* of the gate driving unit DV.

The gate driving unit DV may include electronic elements such as transistors and/or capacitors located in a second direction (y axis direction). The gate driving unit DV may include a portion adjacent to the indentation portion 711 and the remaining portion. As described above, in case that light introduced through the indentation portion 711 reaches the portion of the gate driving unit DV adjacent to the indentation portion 711, there may be a difference between a threshold voltage of a transistor located in the portion of the gate driving unit DV adjacent to the indentation portion 711 and a threshold voltage of a transistor located in the remaining portion of the gate driving unit DV. Accordingly, even in case that the same electrical signal is applied to the transistor located in the portion of the gate driving unit DV adjacent to the indentation portion 711 and the transistor located in the remaining portion of the gate driving unit DV, an electrical signal applied to a pixel electrically connected to the portion of the gate driving unit DV adjacent to the indentation portion 711 may be different from an electrical signal applied to a pixel electrically connected to the remaining portion of the gate driving unit DV. As a result, even in case that it is intended that a luminance of the pixel electrically connected to the portion of the gate driving unit DV adjacent to the indentation portion 711 and a luminance of the pixel electrically connected to the remaining portion of the gate driving unit DV are the same, the luminance may be different. This may cause spots on an image displayed by the display apparatus 1.

Figure 11:
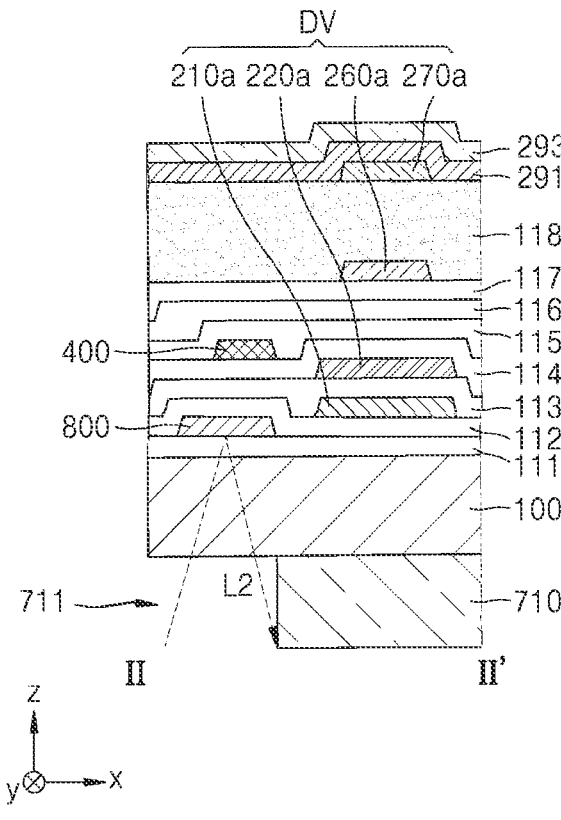
FIG. 11 is a schematic cross-sectional view for describing an external light shielding effect of a display apparatus, according to an embodiment.

However, in the display apparatus 1 according to the embodiment, the shielding portion 800 may be located under the metal wiring 400. As shown in FIG. 11 that is a schematic cross-sectional view for describing an external light shielding effect of the display apparatus 1 according to an embodiment, light L2 obliquely incident on the (–z direction) bottom surface of the shielding portion 800 may be reflected by the (–z direction) bottom surface of the shielding portion 800 to change an optical path, and the reflected light L2 may be reflected to the outside of the display panel 10 through the indentation portion 711 of the first metal plate 710. For example, the light L2 obliquely incident on the (–z direction) bottom surface of the shielding portion 800 may be reflected by the shielding portion 800 located under the metal wiring 400, and thus, the light L2 may be prevented from being reflected by the (–z direction) bottom surface of the metal wiring 400. Accordingly, the light L2 may be prevented or minimized from being incident on the (+z direction) top surface of the first metal plate 710 and reaching the gate driving unit DV.

Although the metal wiring 400 may overlap the indentation portion 711 in case that it is viewed in the direction (z axis direction) perpendicular to the substrate 100 in FIG. 9, the metal wiring 400 may be located adjacent to the indentation portion 711. Because the shielding portion 800 may overlap at least a part of the indentation portion 711, the metal wiring 400 may be shielded from external light introduced into the display panel 10 through the indentation portion 711 of the first metal plate 710.

Figure 12:
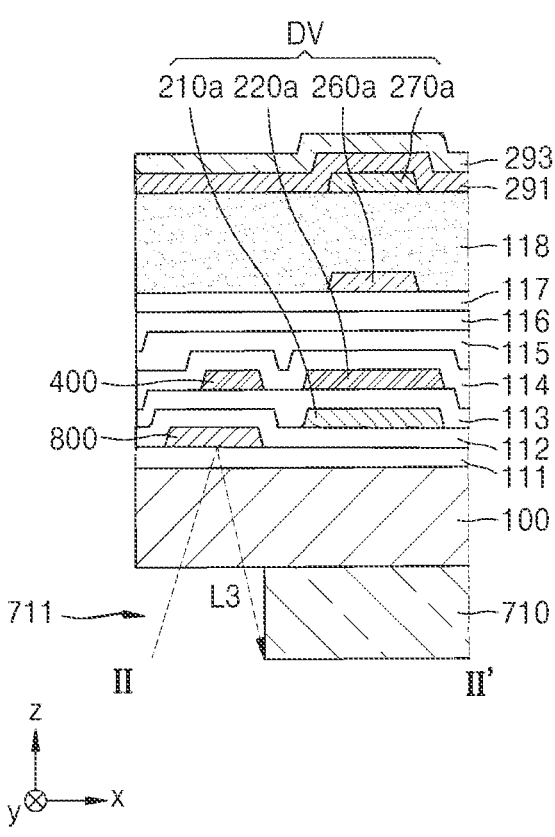
FIG. 12 is a schematic cross-sectional view illustrating a part of a display apparatus, according to an embodiment.

Although the metal wiring 400 is located on the same layer as the conductive layer 230 included in the transistor TFT in FIG. 11, the disclosure is not limited thereto. For example, as shown in FIG. 12 that is a schematic cross-sectional view illustrating a part of the display apparatus 1 according to an embodiment, the metal wiring 400 may be located on the same layer as the first gate layer 220 included in the transistor TFT. For example, the metal wiring 400 may be located on the first gate insulating layer 113. The metal wiring 400 and the first gate layer 220 may be simultaneously formed by using the same material. Accordingly, the metal wiring 400 and the first gate layer 220 may include the same material.

Even in case that the metal wiring 400 is located on the same layer as the first gate layer 220, as shown in FIG. 12, the shielding portion 800 may be located under the metal wiring 400. Accordingly, the shielding portion 800 may shield the metal wiring 400 from external light introduced into the display panel 10 through the indentation portion 711 of the first metal plate 710. In detail, like the light L2, light L3 obliquely incident on the (–z direction) bottom surface of the shielding portion 800 may be reflected by the (–z direction) bottom surface of the shielding portion 800 to change an optical path, and the reflected light L3 may be reflected to the outside of the display panel 10 through the indentation portion 711 of the first metal plate 710. For example, the light L3 obliquely incident on the (–z direction) bottom surface of the shielding portion 800 may be reflected by the shielding portion 800 located under the metal wiring 400, and thus, the light L3 may be prevented from being reflected by the (–z direction) bottom surface of the metal wiring 400. Accordingly, the light L3 may be prevented or minimized from being incident on the (+z direction) top surface of the first metal plate 710 and reaching the gate driving unit DV.

Figure 13:
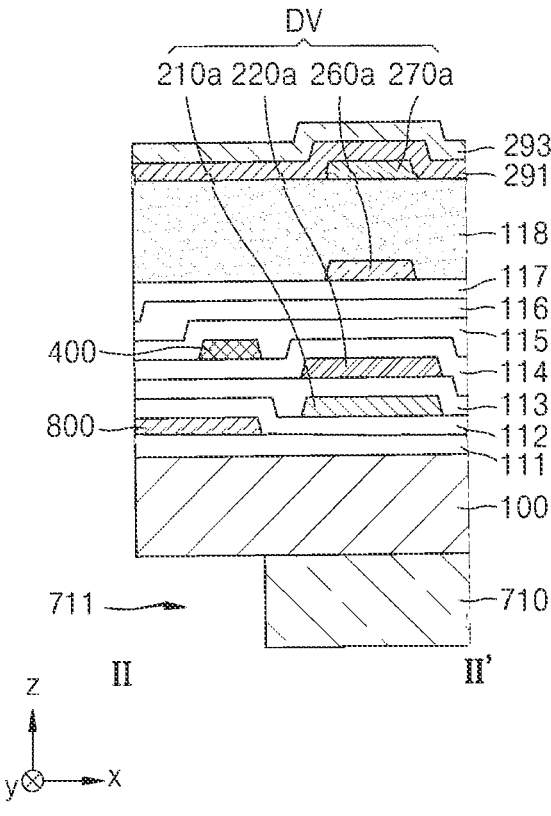
FIG. 13 is a schematic cross-sectional view illustrating a part of a display apparatus, according to an embodiment.

Although a side of the metal wiring 400 and a side of the shielding portion 800 are spaced apart from a side of the substrate 100 in FIGS. 9, 11, and 12, the disclosure is not limited thereto. For example, as shown in FIG. 13 that is a schematic cross-sectional view illustrating a part of the display apparatus according to an embodiment, in case it is viewed in the direction (z axis direction) perpendicular to the substrate 100, a side of the metal wiring 400 may be spaced apart from a side of the substrate 100, but a side of the shielding portion 800 may overlap a side of the substrate 100. The shielding portion 800 may shield the metal wiring 400 more readily from external light introduced into the display panel 10 through the indentation portion 711 of the first metal plate 710.

Figure 14:
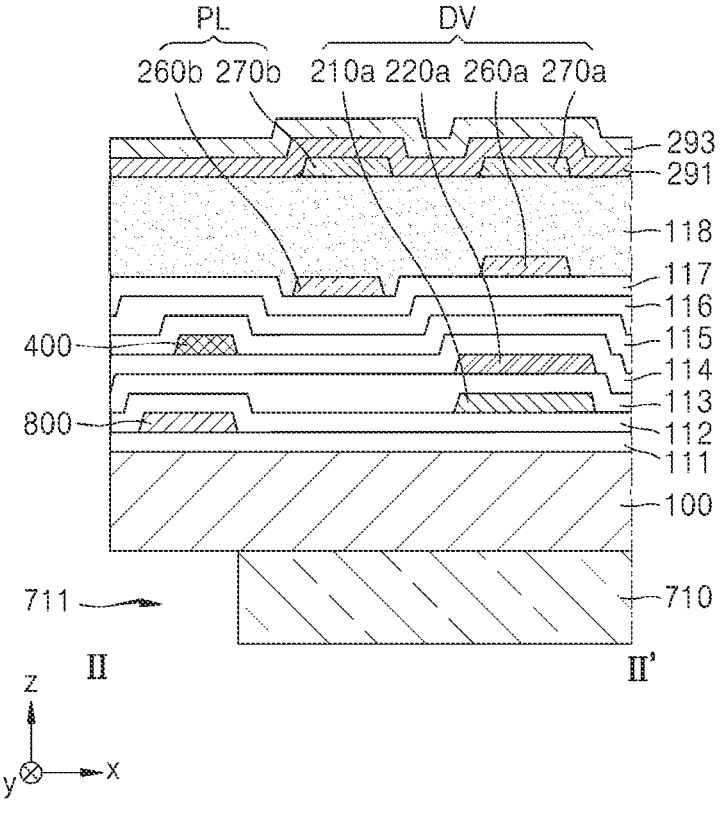
FIG. 14 is a schematic cross-sectional view illustrating a part of a display apparatus, according to an embodiment.

FIG. 14 is a schematic cross-sectional view illustrating a part of the display apparatus 1, according to an embodiment. As shown in FIG. 14, the metal wiring 400 and the gate driving unit DV may be located in the peripheral area PA. The shielding portion 800 may be located under the metal wiring 400.

The driving voltage wiring PL may be located between the metal wiring 400 and the gate driving unit DV. The driving voltage wiring PL may be located outside of the gate driving unit DV, specifically, between a side of the display panel 10 and the gate driving unit DV, may be electrically connected to the pixel P, and may provide the driving voltage EVLDD. In case that it is viewed in the direction (z axis direction) perpendicular to the substrate 100, the driving voltage wiring PL may be located between the indentation portion 711 and the gate driving unit DV, and the driving voltage wiring PL may overlap the first metal plate 710. The driving voltage wiring PL may include, for example, a first layer 260*b* and a second layer 270*b*. The first layer 260*b* may be located on the third interlayer insulating layer 117, and the second layer 270*b* may be located on the first planarization layer 118. The first layer 260*b* may be simultaneously formed by using the same material when the first connection electrode layer 260 included in the transistor TFT is formed, and the second layer 270*b* may be simultaneously formed by using the same material when the second connection electrode layer 270 included in the transistor TFT is formed.

Figure 15:
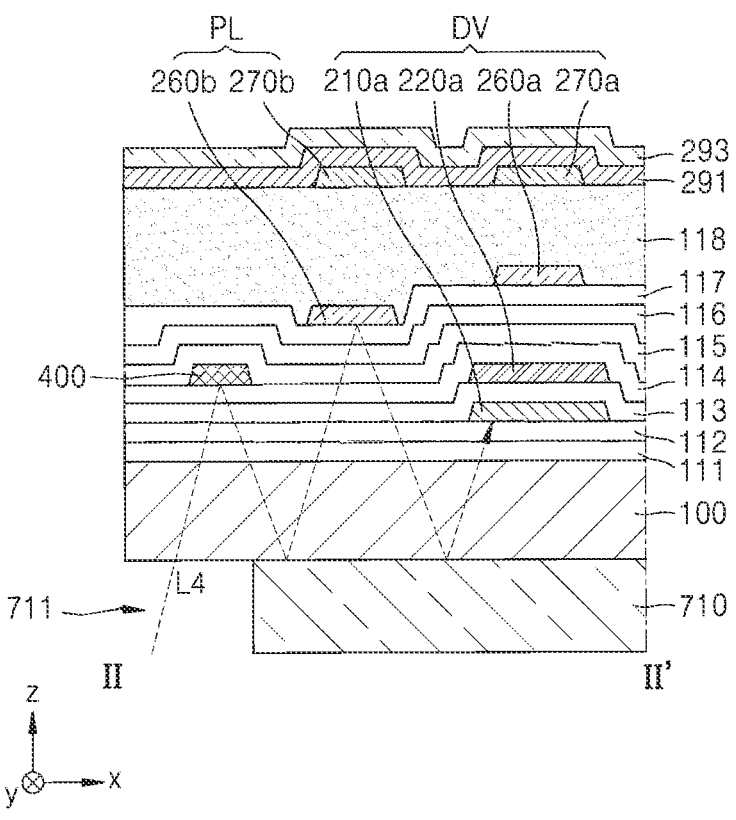
FIG. 15 is a schematic cross-sectional view for describing introduction of external light in a display apparatus according to a comparative example.

As shown in FIG. 15 that is a schematic cross-sectional view for describing introduction of external light in a display apparatus according to a comparative example, in case that the shielding portion 800 is not located under the metal wiring 400, light introduced through the indentation portion 711 of the first metal plate 710 may reach the gate driving unit DV. In detail, light L4 obliquely incident on the (−z direction) bottom surface of the metal wiring 400 may be reflected by the (−z direction) bottom surface of the metal wiring 400 to change an optical path. The reflected light L4 may be obliquely incident on the (+z direction) top surface of the first metal plate 710, and may be reflected by the (+z direction) top surface of the first metal plate 710 to change an optical path. The light L4 may be obliquely incident on a (−z direction) bottom surface of the first layer 260*b* of the driving voltage wiring PL, and may be reflected by the (−z direction) bottom surface of the first layer 260*b* to change an optical path. Finally, the light L4 may be reflected by the (+z direction) top surface of the first metal plate to change an optical path, and thus, the light L4 may reach the first layer 210*a* of the gate driving unit DV.

As described above, in case that light introduced through the indentation portion 711 reaches a portion of the gate driving unit DV adjacent to the indentation portion 711, there may be a difference between a threshold voltage of a transistor located in the portion of the gate driving unit DV adjacent to the indentation portion 711 and a threshold voltage of a transistor located in the remaining portion of the gate driving unit DV. Accordingly, even in case that the same electrical signal is applied to the transistor located in the portion of the gate driving unit DV adjacent to the indentation portion 711 and the transistor located in the remaining portion of the gate driving unit DV, an electrical signal applied to a pixel electrically connected to the portion of the gate driving unit DV adjacent to the indentation portion 711 may be different from an electrical signal applied to a pixel electrically connected to the remaining portion of the gate driving unit DV. As a result, even in case that it is intended that a luminance of the pixel electrically connected to the portion of the gate driving unit DV adjacent to the indentation portion 711 and a luminance of the pixel electrically connected to the remaining portion of the gate driving unit DV are the same, the luminances may be different. This may cause spots on an image displayed by the display apparatus 1.

Figure 16:
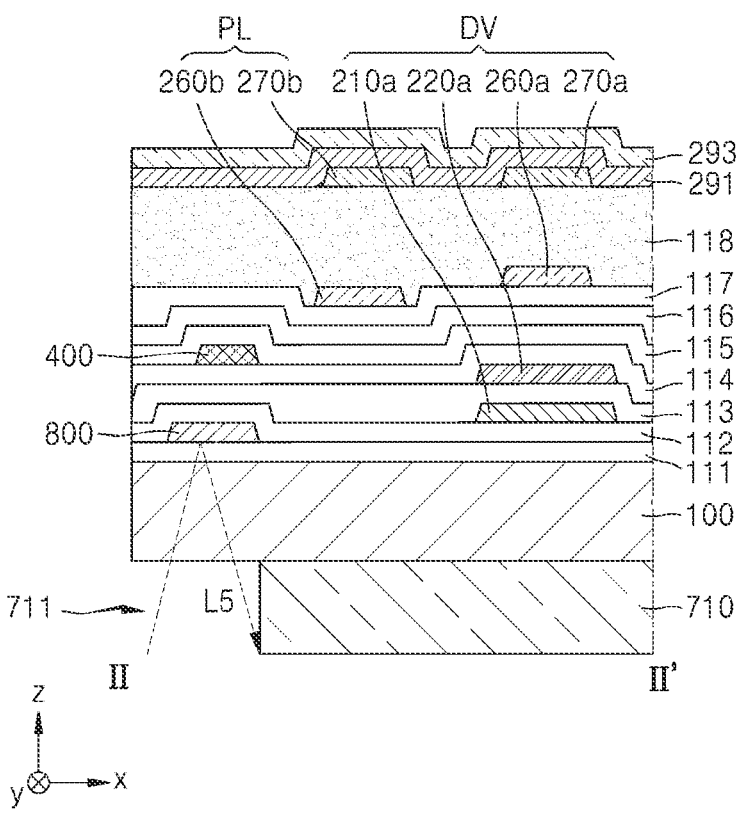
FIG. 16 is a schematic cross-sectional view for describing an external light shielding effect of a display apparatus, according to an embodiment.

However, as shown in FIG. 16 that is a schematic cross-sectional view for describing an external light shielding effect of the display apparatus 1 according to an embodiment, in the display apparatus 1 according to the embodiment, the shielding portion 800 may be located under the metal wiring 400. Accordingly, like the light L2, light L5 obliquely incident on the (−z direction) bottom surface of the shielding portion 800 may be reflected by the (−z direction) bottom surface of the shielding portion 800 to change an optical path, and the reflected light L5 may be reflected to the outside of the display panel 10 through the indentation portion 711 of the first metal plate 710. For example, the light L5 obliquely incident on the (−z direction) bottom surface of the shielding portion 800 may be reflected by the shielding portion 800 located under the metal wiring 400, and thus, the light L5 may be prevented from being reflected by the (−z direction) bottom surface of the metal wiring 400. Accordingly, the light L5 may be prevented or minimized from being incident on the (+z direction) top surface of the first metal plate 710 and reaching the gate driving unit DV.

Although a side of the metal wiring 400 and a side of the shielding portion 800 are spaced apart from a side of the substrate 100 in FIGS. 14 and 16, the disclosure is not limited thereto. For example, in case that it is viewed in the direction (z axis direction) perpendicular to the substrate 100, a side of the metal wiring 400 may be spaced apart from a side of the substrate 100, but a side of the shielding portion 800 may overlap a side of the substrate 100. The shielding portion 800 may shield the metal wiring 400 more readily from external light introduced into the display panel 10 through the indentation portion 711 of the first metal plate 710.

Figure 17:
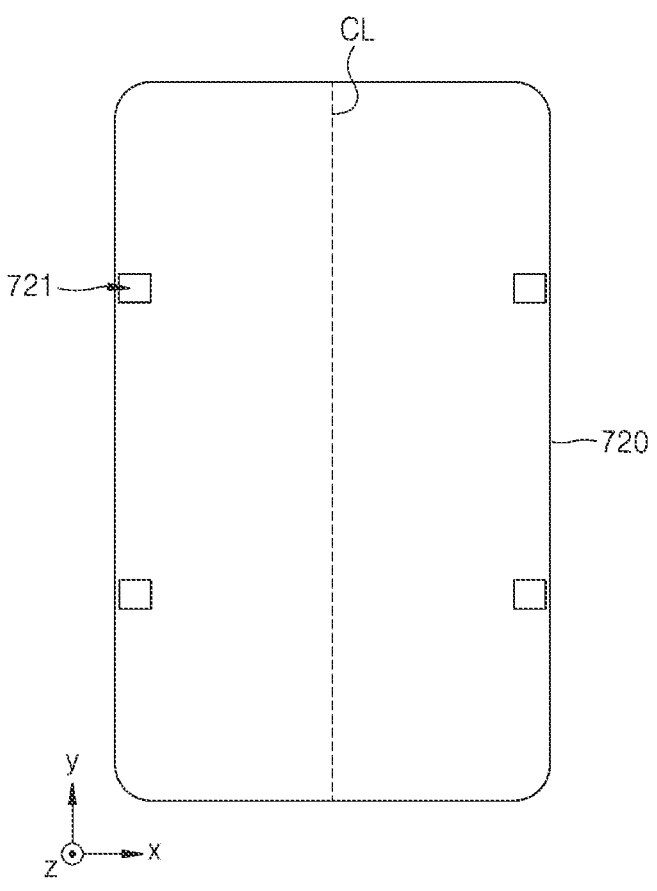
FIG. 17 is a plan view illustrating a second metal plate of a display apparatus according to an embodiment.

FIG. 17 is a plan view (+z direction) illustrating a second metal plate 720 of the display apparatus 1 according to an embodiment. The metal plate 700 may include a second metal plate 720, and the second metal plate 720 may include a (+z direction) top surface and a (−z direction) bottom surface. As shown in FIG. 17, the second metal plate 720 may include multiple opening portions 721. Some of the opening portions 721 may be located on a side of the second metal plate 720, and the rest of the opening portions 721 may be located on another side. In detail, the opening portions 721 may be symmetrically arranged about a central line CL of the second metal plate 720 or may be arranged with a similar separation distance. The second metal plate 720 may be attached to a designated position of the display panel 10, by locating the alignment keys AK to respectively correspond to the multiple opening portions 721.

Figure 18:
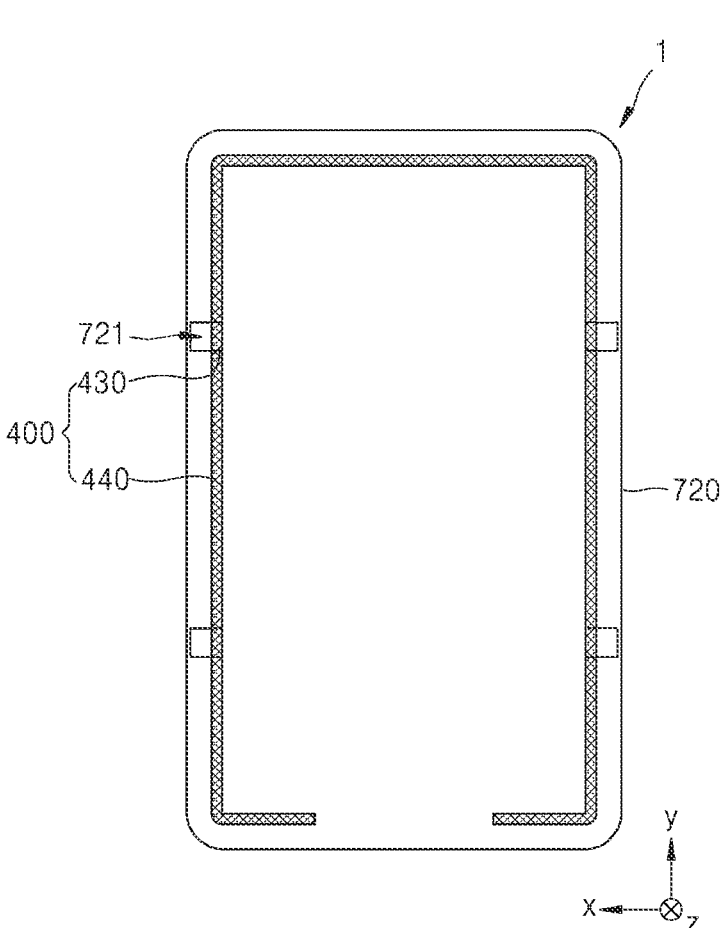
FIG. 18 is a bottom view illustrating a display apparatus according to an embodiment.
Figure 19:
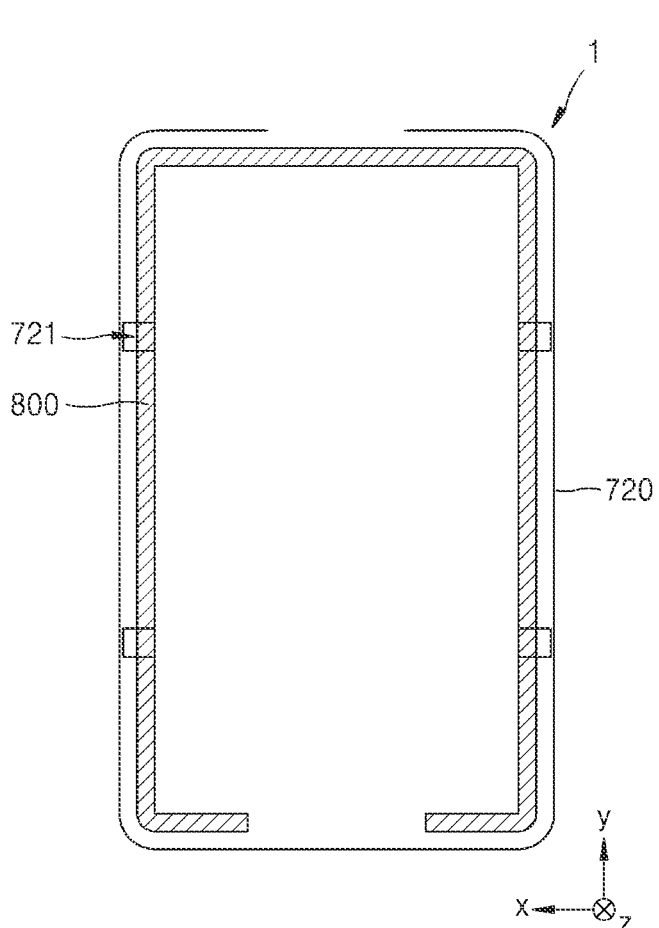
FIG. 19 is a bottom view illustrating a display apparatus according to an embodiment.

FIGS. 18 and 19 are bottom views (−z direction) illustrating the display apparatus 1 according to an embodiment. However, for convenience of explanation, the metal wiring 400 is also illustrated in FIG. 18. As shown in FIG. 18, in case that the (+z direction) top surface of the second metal plate 720 is attached to the (−z direction) bottom surface of the display panel 10, a part of the metal wiring 400 of the display panel 10 may overlap the opening portion 721 of the second metal plate 720. In detail, the metal wiring 400 may include a third portion 430 overlapping the opening portion 721 in case that it is viewed in the direction (z axis direction) perpendicular to the substrate 100, and a fourth portion 440 extending from the third portion 430 and overlapping the second metal plate 720 in case that it is viewed in the direction (z axis direction) perpendicular to the substrate 100.

The metal wiring 400 may be shielded by the shielding portion 800. In FIG. 19, for convenience of explanation, the shielding portion 800 is also illustrated. As shown in FIG. 19, in case that the (+z direction) top surface of the second metal plate 720 is attached to the (−z direction) bottom surface of the display panel 10, a part of the shielding portion 800 of the display panel 10 may overlap the opening portion 721 of the second metal plate 720. In detail, a portion of the shielding portion 800 overlapping the opening portion 721 may also overlap the third portion 430 of the metal wiring 400. Also, the remaining portion of the shielding portion 800 may overlap the fourth portion 440 of the metal wiring 400. Accordingly, the metal wiring 400 may be shielded by the shielding portion 800. Although the shielding portion 800 overlaps the third portion 430 and the fourth portion 440 in FIG. 19, the disclosure is not limited thereto. For example, the shielding portion 800 may overlap only the third portion 430.

In case that it is viewed in the direction (z axis direction) perpendicular to the substrate 100, the third portion 430 of the metal wiring 400 may be located adjacent to the opening portion 721. The metal wiring 400 may include the fourth portion 440 extending from the third portion 430 and overlapping the second metal plate 720 in case that it is viewed in the direction (z axis direction) perpendicular to the substrate 100. A part of the shielding portion 800 may overlap the opening portion 721, and the remaining portion of the shielding portion 800 may overlap the fourth portion 440 of the metal wiring 400. Because an effect obtained in case that the shielding portion 800 shields the metal wiring 400 whose part overlaps the indentation portion 711 from external light also occurs even in case that the shielding portion 800 shields the metal wiring 400 whose part overlaps the opening portion 721 from external light, for convenience, the same description made with reference to FIGS. 1 through 16 will not be repeatedly provided. For example, the description made with reference to FIGS. 1 through 16 may be applied to the display apparatus 1 according to the embodiment, except that the metal plate 700 includes the opening portion 721, instead of the indentation portion 711.

Figure 20:
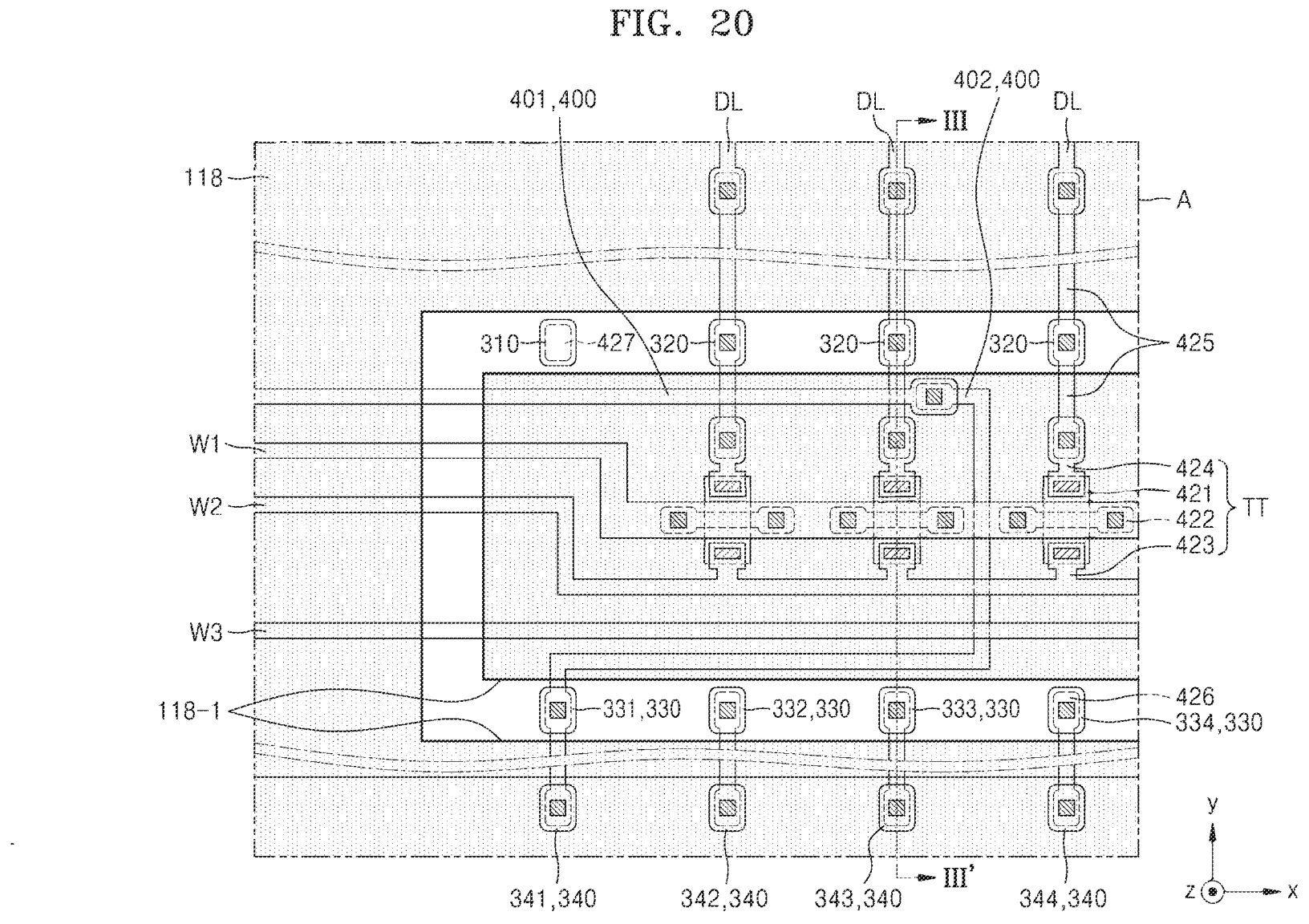
Figure 21:
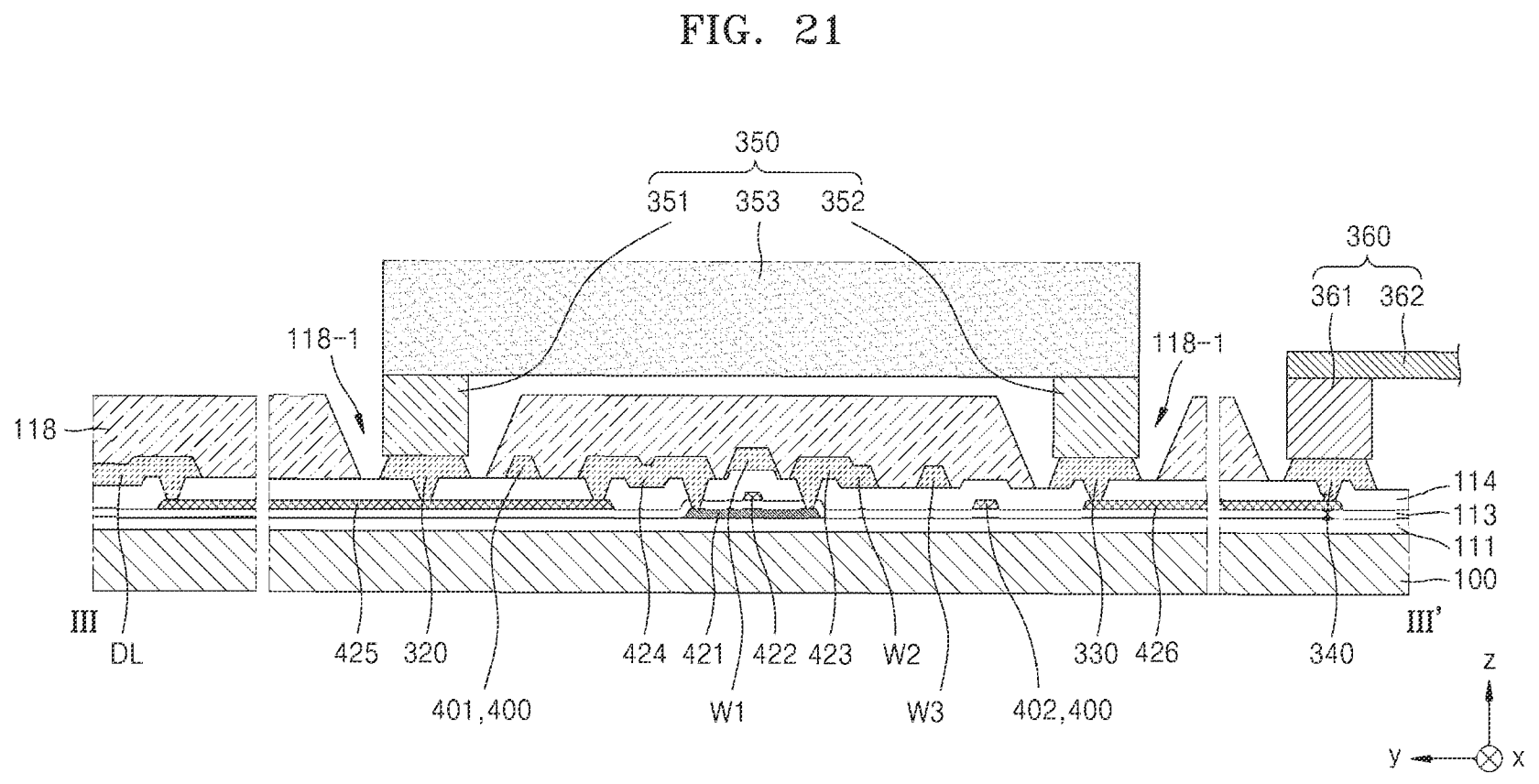

FIG. 20 is a view illustrating a portion A of FIG. 2. FIG. 21 is a schematic cross-sectional view taken along line III-III' of FIG. 20. As described above, the metal wiring 400 may be located outside of the display area DA to surround at least a part of the display area DA. For example, the metal wiring 400 may extend along an outer side of the display area DA to surround the display area DA.

As shown in FIG. 20, the display apparatus 1 according to the embodiment includes multiple test thin-film transistors TT and multiple pads (e.g., 310, 320, 330, and 340) located in the peripheral area PA, specifically, in the pad unit PD.

The test thin-film transistors TT may be transistors for determining whether pixels of the display area DA normally operate in a manufacturing process. Each of the multiple test thin-film transistors TT may include a semiconductor layer 421, a gate electrode 422, a source electrode 423, and a drain electrode 424 as shown in FIGS. 20 and 21. The semiconductor layer 421 of the test thin-film transistor TT may include the same material and may be located on the same layer as the first semiconductor layer 210 included in the transistor TFT. The gate electrode 422 of the test thin-film transistor TT may include the same material and may be located on the same layer as the first gate layer 220 included in the transistor TFT. The source electrode 423 and the drain electrode 424 of the test thin-film transistor TT may include the same material and may be located on the same layer as the conductive layer 230 included in the transistor TFT. For example, in order to secure insulation between the semiconductor layer 421 and the gate electrode 422, the first gate insulating layer 113 may be located between the semiconductor layer 421 and the gate electrode 422. The source electrode 423 and the drain electrode 424 may be located on the first interlayer insulating layer 114.

For reference, in FIG. 20, for convenience, the first gate insulating layer 113 and the first interlayer insulating layer 114 are not illustrated, and only relative positions between the semiconductor layer 421, the gate electrode 422, the source electrode 423, and the drain electrode 424 is illustrated. In FIG. 20, other various wirings and pads are also illustrated. The buffer layer 111 may be located between the test thin-film transistor TT and the substrate 100.

The gate electrodes 422 of the multiple test thin-film transistors TT may be electrically connected to one another, by a first wiring W1 that is a bridge wiring. For example, the first wiring W1 located on a layer different from a layer on which the gate electrodes 422 are located may electrically connect the gate electrodes 422 that are spaced apart from one another. For example, the first wiring W1 may be located on the first interlayer insulating layer 114, and may electrically connect the gate electrodes 422 that are spaced apart from each other by contacting (e.g., directly contacting) the gate electrodes 422 through contact holes formed in the first interlayer insulating layer 114 located between the first wiring W1 and the gate electrodes 422. Accordingly, at least a part of the first wiring W1 and the gate electrodes 422 may be located on a virtual straight line (extending along the x axis) as shown in FIG. 20.

Because each of the test thin-film transistors TT may include the source electrode 423 and the drain electrode 424, the first wiring W1, and the source electrode 423 and the drain electrode 424 may include the same material, for example, metal such as titanium, copper, or aluminum, and may have a single or multi-layer structure. In case that the first wiring W1 has a multi-layer structure, the first wiring W1 may have a three-layer structure including titanium/aluminum/titanium. Furthermore, the first wiring W1 may be located on the same layer, for example, the first interlayer insulating layer 114, as the source electrode 423 and the drain electrode 424. Accordingly, the first wiring W1 may be electrically connected to the gate electrodes 422 located under the first wiring W1 through the contact holes formed in the first interlayer insulating layer 114.

The multiple data wirings DL may cross the display area DA and may extend to the peripheral area PA. Each of the multiple test thin-film transistors TT may be electrically connected to a corresponding one of the multiple data wirings DL. Accordingly, in case that electrical signals are simultaneously applied to the gate electrodes 422 which are electrically connected to one another of the multiple test thin-film transistors TT, channels may be simultaneously formed in the semiconductor layers 421 of the multiple test thin-film transistors TT. As such, in case that the multiple test thin-film transistors TT are simultaneously turned on, an electrical signal from a second wiring W2 that is a test signal line may be transmitted to the multiple data wirings DL. Accordingly, pixels of the display area DA electrically connected to the multiple data wirings DL may emit light, thereby making it possible to test whether the pixels in the display area DA have defects.

The test thin-film transistors TT may be turned off after the manufacture of the display apparatus is completed. For example, in case that the test thin-film transistors TT are P-type thin-film transistors, the test thin-film transistors TT may be turned off by applying a VGH bias voltage (positive bias voltage) to the first wiring W1. Accordingly, a signal from a driving chip 350 described below may be applied through the first pads 320 to the data wirings DL.

The gate electrodes 422 may include a metal such as molybdenum or aluminum, and may have a single or multi-layer structure. In case that the gate electrodes 422 have a multi-layer structure, the gate electrodes 422 may have a three-layer structure including molybdenum/aluminum/molybdenum. The gate electrodes 422 may be located on the first gate insulating layer 113 as described above.

As described above, the multiple data wirings DL may cross the display area DA and extend to the peripheral area PA. The multiple data wirings DL may include the same material, for example, metal such as titanium, copper, or aluminum, as that of the source electrode 423 and the drain electrode 424 of the test thin-film transistor TT, and may have a single or multi-layer structure. In case that the multiple data wirings DL have a multi-layer structure, the multiple data wirings DL may have a three-layer structure including titanium/aluminum/titanium. Furthermore, the multiple data wirings DL may be located on the same layer as a layer on which the source electrode 423 and the drain electrode 424 are located. The multiple test thin-film transistors TT may be electrically connected to corresponding ones of the multiple data wirings DL, by intermediate wirings 425. For example, the intermediate wirings 425 may electrically connect the multiple data wirings DL to the multiple test thin-film transistors TT.

The intermediate wirings 425 may include the same material, for example, metal such as molybdenum or aluminum, as that of the gate electrodes 422, and may have a single or multi-layer structure. In case that the intermediate wirings 425 have a multi-layer structure, the intermediate wirings 425 may have a three-layer structure including molybdenum/aluminum/molybdenum. Furthermore, the intermediate wirings 425 may be located on the same layer as a layer on which the gate electrodes 422 are located. An end of the intermediate wiring 425 close to the data wiring DL may be electrically connected to the data wiring DL located over the intermediate wiring 425 through a contact hole formed in the first interlayer insulating layer 114, and an end of the intermediate wiring 425 close to the test thin-film transistor TT may be electrically connected to the drain electrode 424 located over the intermediate wiring 425 through a contact hole formed in the first interlayer insulating layer 114. The source electrodes 423 of the test thin-film transistors TT may be electrically connected to a 2-2$^{th}$ wiring W2-2 (having a portion extending in the x axis direction) which is a part of the second wiring W2 that is a test signal line, and specifically, the source electrodes 423 may be integrally formed with the 2-2$^{th}$ wiring W2-2.

As shown in FIGS. 20 and 21, the display apparatus 1 may include multiple first pads 310, 320, and 330. The first pads 320 located close to the display area DA (+y direction) with respect to the multiple test thin-film transistors TT among the multiple first pads 310, 320, and 330 may be located over corresponding ones of the intermediate wirings 425, and may contact the corresponding ones of the intermediate wirings 425. The multiple first pads 310, 320, and 330 may include the same material, for example, metal such as titanium, copper, or aluminum, as that of the source electrode 423 and the drain electrode 424 of the test thin-film transistor TT, and may have a single or multi-layer structure. In case that the multiple first pads 310, 320, and 330 have a multi-layer structure, the first pads 310, 320, and 330 may have a three-layer structure including titanium/aluminum/titanium. Furthermore, the multiple first pads 310, 320, and 330 may be located on the same layer as a layer on which the source electrode 423 and the drain electrode 424 are located. Accordingly, the multiple first pads 310, 320, and 330 may be electrically connected to the intermediate wiring 425 located under the multiple first pads 310, 320, and 330 through contact holes formed in the first interlayer insulating layer 114.

The first pad 310 among the multiple first pads 310, 320, and 330 may be a dummy pad that is not electrically connected to other electrical elements formed on the substrate 100. A height from a bottom surface of the substrate 100 to top surfaces of the first pads 320 electrically connected to the data wiring DL may need to be almost similar to a height from the bottom surface of the substrate 100 to a top surface of the first pad 310 that is a dummy pad. To this end, because the intermediate wirings 425 may be located under the first pads 320 electrically connected to the data wiring DL, a step difference adjusting unit 427 may be located under the first pad 310 that is a dummy pad, close to the substrate 100. The step difference adjusting unit 427 may include the same material as that of the intermediate wirings 425 and the gate electrodes 422, for example, a metal such as molybdenum or aluminum, and may have the same layer structure as that of the intermediate wirings 425.

The first pads 320 among the multiple first pads 310, 320, and 330 may be located close to the display area DA (+y direction) with respect to the multiple test thin-film transistors TT, and the first pads 330 among the multiple first pads 310, 320, and 330 may be located far from the display area DA (−y direction) with respect to the multiple test thin-film transistors TT. The first pads 320 and the first pads 330 may be electrically connected to the driving chip 350 included in the display apparatus 1 through an anisotropic conductive film (not shown, for convenience) as shown in FIG. 21.

The multiple first pads 310, 320, and 330 may be located on the first interlayer insulating layer 114 covering the peripheral area PA as described above. In the peripheral area PA, the first planarization layer 118 may be located on the first interlayer insulating layer 114. The first interlayer insulating layer 114 and the first planarization layer 118 may also exist in the display area DA as shown in FIG. 2. The first planarization layer 118 may include an organic material such as acryl, benzocyclobutene (BCB), or hexamethyldisiloxane (HMDSO). The first planarization layer 118 may have an opening 118-1 through which the multiple first pads 310, 320, and 330 may be exposed.

The driving chip 350 may include a body 353, and output terminals 351 and input terminals 352 located on both sides of the body 353. Although only one output terminal 351 and one input terminal 352 of the driving chip 350 are illustrated in FIG. 21, the driving unit 350 may include multiple output terminals 351 and multiple input terminals 352 (arranged in the x axis direction). The driving chip 350 may be, for example, an integrated circuit (IC) chip.

The first pads 330 exposed through the opening 118-1 of the first planarization layer 118 may be electrically connected to the input terminals 352 of the driving chip 350, and the first pads 320 may be electrically connected to the output terminals 351 of the driving chip 350. Accordingly, in case that the display apparatus is actually driven, not for a test, an electrical signal from the driving chip 350 may be transmitted from the output terminals 351 of the driving chip 350 through the first pads 320 and the intermediate wirings 425 to the data wirings DL, and thus, finally transmitted to the multiple pixels in the display area DA.

Information about an image to be displayed in the display area DA may be input to the driving chip 350 through the input terminals 352 of the driving chip 350. To this end, the display apparatus may include a printed circuit board 360 including a plate 362 and output terminals 361. Although only one output terminal 361 of the printed circuit board 360 is illustrated in FIG. 21, the printed circuit board 360 may include multiple output terminals 362 (arranged in the x axis direction).

The display apparatus 1 may include the second pads 340 located far from the display area DA (−y direction) with respect to the first pads 330. The second pads 340 may include the same material, for example, metal such as titanium, copper, or aluminum, as that of the source electrode 423 and the drain electrode 424 of the thin-film transistor TT, and may have a single or multi-layer structure. In case that the second pads 340 have a multi-layer structure, the second pads 340 may have a three-layer structure including titanium/aluminum/titanium. Furthermore, the second pads 340 may be located on the same layer as a layer on which the source electrode 423 and the drain electrode 424 are located. For example, the second pads 340 may be located on the first interlayer insulating layer 114.

The second pads 340 may be electrically connected to the first pads 330 by second connection wirings 426. The second connection wirings 426 may include the same material, for example, metal such as molybdenum or aluminum, as that of the gate electrodes 422, and may have a single or multi-layer structure. In case that the second connection wirings 426 have a multi-layer structure, the second connection wirings 426 may have a three-layer structure including molybdenum/aluminum/molybdenum. Furthermore, the second connection wirings 426 may be located on the same layer as a layer on which the gate electrodes 422 are located. For example, the second connection wirings 426 may be located between the first gate insulating layer 113 and the first interlayer insulating layer 114. An end of the second connection wiring 426 close to the display area DA may be electrically connected to the first pad 330 located over the second connection wiring 426 through a contact hole formed in the first interlayer insulating layer 114, and another end of the second connection wiring 426 may be electrically connected to the second pad 340 located over the second connection wiring 426 through a contact hole formed in the first interlayer insulating layer 114.

As described above, information about an image to be displayed in the display area DA may be input to the driving chip 350 through the input terminals 352 of the driving chip 350. To this end, the output terminals 361 of the printed circuit board 360 may be electrically connected to the second pads 340 through an anisotropic conductive film (not shown), the second pads 340 may be electrically connected to the first pads 330 by the second connection wirings 426, and the first pads 330 may be electrically connected to the input terminals 352 of the driving chip 350.

As the input terminals 352 of the driving chip 350 may be electrically connected to the first pads 330 through an anisotropic conductive film and the output terminals 351 of the driving chip 350 may be electrically connected to the first pads 320 through an anisotropic conductive film, as shown in FIG. 21, the driving chip 350 may be located over the test thin-film transistors TT. In this process, the first pad 310 that is a dummy pad not electrically connected to other electrical elements formed on the substrate 100 may be also electrically connected to the input terminal 352 of the driving chip 350 through an anisotropic conductive film.

As described above, because the step difference adjusting unit 427 may be located under the first pad 310 that is a dummy pad close to the substrate 100, a height from a bottom surface of the substrate 100 to top surfaces of the first pads 320 electrically connected to the data wiring DL and a height from the bottom surface of the substrate 100 to a top surface of the first pad 310 are similar or the same. Accordingly, the driving chip 350 may be stably located.

As shown in FIG. 20, the metal wiring 400 may include a first metal wiring 401 and a second metal wiring 402. The first metal wiring 401 may cross an opening 118-1 of the first planarization layer 118 in the peripheral area PA of the substrate 100, in case that it is viewed in the direction (z axis direction) perpendicular to the substrate 100. The first metal wiring 401 may be located on the first interlayer insulating layer 114. The first metal wiring 401 may include the same material, for example, metal such as titanium, copper, or aluminum, as that of the source electrode 423 and the drain electrode 424, and may have the same layer structure as that of the first pads 310, 320, and 330, the source electrode 423, and the drain electrode 424. For example, the first metal wiring 401 may have a single or multi-layer structure. In case that the first metal wiring 401 has a multi-layer structure, the first metal wiring 401 may have a three-layer structure including titanium/aluminum/titanium.

The first metal wiring 401 may be electrically connected to the second metal wiring 402 located under the first metal wiring 401 through a contact hole formed in the first interlayer insulating layer 114. The second metal wiring 402 may be located under the first interlayer insulating layer 114, and specifically, may be located on the first gate insulating layer 113. Accordingly, the second metal wiring 402 may include the same material, for example, metal such as molybdenum or aluminum, as that of the gate electrodes 422, and may have the same layer structure as that of the gate electrodes 422. For example, the second metal wiring 402 may have a single or multi-layer structure. In case that the second metal wiring 402 has a multi-layer structure, the second metal wiring 402 may have a three-layer structure including molybdenum/aluminum/molybdenum. Furthermore, the second metal wiring 402 may be located on the same layer as a layer on which the gate electrodes 422 are located.

The second metal wiring 402 may be electrically connected to a first pad 331 that is one of the first pads 330. For example, the second metal wiring 402 may extend to a lower portion of the first pad 331, and may be electrically connected to the first pad 331 located over the second metal wiring 402 through a contact hole formed in the first interlayer insulating layer 114. Also, the first pad 331 may be electrically connected to a second pad 341 that is one of the second pads 340 through the second connection wiring 426.

For reference, a first pad 332, a first pad 333, and a first pad 334 among the first pads 330 are not electrically connected to other wirings close to the display area DA (+y direction) in FIG. 20. However, this is merely an example for convenience, and the first pad 332, the first pad 333, or the first pad 334 may be electrically connected to other wirings. The other wirings may be a wiring located between the first gate insulating layer 113 and the first interlayer insulating layer 114, or may be a wiring located on the first interlayer insulating layer 114. This applies to the following embodiments and modifications thereof.

As shown in FIG. 20, the display apparatus 1 according to the embodiment may include the first wiring W1. The first wiring W1 may cross the opening 118-1 of the first planarization layer 118 in the peripheral area PA of the substrate 100, in case that it is viewed in the direction (z axis direction) perpendicular to the substrate 100. Also, as shown in FIG. 20, the first metal wiring 401 may include a portion adjacent to and parallel to at least a part of the first wiring W1.

The first wiring W1 may be a bridge wiring as described above, and may electrically connect the gate electrodes 422 that are spaced apart from one another. The first wiring W1 may electrically connect the gate electrodes 422 that are spaced apart from one another, by contacting (e.g., directly contacting) the first gates 422 through contact holes formed in the first interlayer insulating layer 114 located between the first wiring W1 and the gate electrodes 422.

As described above, the display apparatus 1 according to the embodiment may include the second wiring W2 that is a test signal line. The second wiring W2 may cross the opening 118-1 of the first planarization layer 118 in the peripheral area PA of the substrate 100, in case that it is viewed in the direction (z axis direction) perpendicular to the substrate 100. Also, as shown in FIG. 20, the second wiring W2 may include a portion that is adjacent to and parallel to at least a part of the first wiring W1.

The second wiring W2 that is a test signal line may be electrically connected to the source electrodes 423 of the test thin-film transistors TT, and specifically, the second wiring W2 may be integrally formed with the source electrodes 423. For example, the second wiring W2 may be located on the first interlayer insulating layer 114. The second wiring W2 may include the same material, for example, metal such as titanium, copper, or aluminum, as that of the first pads 310, 320, and 330, the source electrode 423, and the drain electrode 424, and may have the same layer structure as that of the first pads 310, 320, and 330, the source electrode 423, and the drain electrode 424. For example, the second wiring W2 may have a single or multi-layer structure. In case that the second wiring W2 has a multi-layer structure, the second wiring W2 may have a three-layer structure including titanium/aluminum/titanium.

As described above, the multiple test thin-film transistors TT may be test thin-film transistors for determining whether pixels of the display area DA normally operate in a manufacturing process. The first wiring W1 and the second wiring W2 electrically connected to the multiple test thin-film transistors TT may be wirings for applying a test signal to the data wirings DL. For example, a test gate signal may be applied to the multiple test thin-film transistors TT through the first wiring W1, and a test data signal may be transmitted to the multiple data wirings DL through the second wiring W2.

As shown in FIG. 20, the display apparatus according to the embodiment may include a third wiring W3. The third wiring W3 may cross the opening 118-1 of the first planarization layer 118 in the peripheral area PA of the substrate 100, in case that it is viewed in the direction (z axis direction) perpendicular to the substrate 100. Also, as shown in FIG. 20, the third wiring W3 may include a portion that is adjacent to and parallel to at least a part of the second wiring W2.

The third wiring W3 may be located on the first interlayer insulating layer 114. The third wiring W3 may include the same material, for example, metal such as titanium, copper, or aluminum, as that of the first metal wiring 401, and may have the same layer structure as that of the first metal wiring 401. For example, the third wiring W3 may have a single or multi-layer structure. In case that the third wiring W3 has a multi-layer structure, the third wiring W3 may have a three-layer structure including titanium/aluminum/titanium.

Like the second wiring W2, the third wiring W3 electrically connected to the source electrodes 423 of the test thin-film transistors TT to which the second wiring W2 is not electrically connected in a region not shown in FIG. 20 may be a wiring for applying a test signal to the data wirings DL electrically connected to the test thin-film transistors TT.

FIG. 20 illustrates portion A of FIG. 2. The portion B of FIG. 2 has a shape obtained by laterally inverting FIG. 20.

As described above, the metal wiring 400 may be used to determine whether a crack occurred in the display panel 10. An end of the metal wiring 400 surrounding the display area DA may be electrically connected to the first pad 331 in the portion A, and another end of the metal wiring 400 may be electrically connected to a pad in the portion B. Accordingly, it may be determined whether a crack occurs in the display panel 10, by applying an electrical signal between the first pad 331 of the portion A and the pad corresponding to the first pad 331 in the portion B and measuring a voltage and/or current. This is because, in case that a crack occurred at an edge of the display panel 10 in a manufacturing process, the metal wiring 400 may be electrically disconnected due to the crack, and thus, an electrical signal detected between the first pad 330 of the portion A and the corresponding pad of the portion B may be different from that in a normal case. After the manufacture of the display apparatus 1 is completed, a direct current (DC) bias voltage may be applied from a power supply of the display apparatus 1 to the metal wiring 400.

According to an embodiment of a method of manufacturing a display apparatus according to the disclosure, a display apparatus capable of reducing the risk of defects in a manufacturing process and a method of manufacturing the display apparatus may be provided. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
a metal plate comprising an indentation portion indented inward from a side of the metal plate; and
a display panel located on the metal plate,
wherein the display panel comprises:
a substrate;
a display area including a plurality of pixels configured to display an image; and
a peripheral area disposed external to the display area,
wherein the peripheral area comprises:
a metal wiring located on the substrate, and comprising a first portion overlapping or adjacent to the indentation portion in a plan view;
a gate driving part located on the substrate, overlapping the metal plate in a plan view, and located adjacent to the metal wiring; and
a shielding portion located between the substrate and the metal wiring, and overlapping at least a part of the indentation portion in a plan view.

2. The display apparatus of claim 1, wherein
the metal wiring further comprises a second portion extending from the first portion and overlapping the metal plate in a plan view, and the shielding portion overlaps the second portion in a plan view.

3. The display apparatus of claim 1, wherein the metal wiring extends along an outer side of the display area and surrounds the at least part of the display area, the display area being a portion where an image is displayed and where pixels are disposed, the peripheral area being disposed external to the display area, the peripheral area being a portion absent of any pixels and where no image is displayed, and the metal wiring, the gate driving part and the shielding portion being disposed in the peripheral area and not in the display area.

4. The display apparatus of claim 1, wherein the display panel further comprises:

a shielding layer located on the substrate;

an inorganic insulating layer covering the shielding layer;

a semiconductor layer located on the inorganic insulating layer;

a gate insulating layer covering the semiconductor layer; and a gate layer located on the gate insulating layer.

5. The display apparatus of claim 4, wherein the metal wiring is located on the gate insulating layer.

6. The display apparatus of claim 4, wherein the display panel further comprises:

an interlayer insulating layer covering the gate layer; and a conductive layer located on the interlayer insulating layer, and the metal wiring is located on the interlayer insulating layer.

7. The display apparatus of claim 6, wherein the metal wiring and the conductive layer include a same material.

8. The display apparatus of claim 4, wherein the shielding portion and the shielding layer are located on a same layer.

9. The display apparatus of claim 4, wherein the shielding portion and the shielding layer include a same material.

10. The display apparatus of claim 1, wherein the display panel further comprises a driving voltage wiring located between the indentation portion and the gate driving part in a plan view.

11. A display apparatus comprising:

a metal plate comprising an opening portion on a side; and a display panel located on the metal plate, wherein the display panel comprises:

a substrate;

a display area including a plurality of pixels configured to display an image; and a peripheral area disposed external to the display area, wherein the peripheral area comprises:

a metal wiring located on the substrate, and comprising a third portion overlapping or adjacent to the opening portion in a plan view;

a gate driving part located on the substrate, overlapping the metal plate in a plan view, and located adjacent to the metal wiring; and a shielding portion located between the substrate and the metal wiring, and overlapping at least a part of the opening portion in a plan view.

12. The display apparatus of claim 11, wherein the metal wiring comprises a fourth portion extending from the third portion and overlapping the metal plate in a plan view, and the shielding portion overlaps the fourth portion in a plan view.

13. The display apparatus of claim 11, wherein the metal wiring extends along an outer side of the display area and surrounds the at least part of the display area.

14. The display apparatus of claim 11, wherein the display panel further comprises:

a shielding layer located on the substrate;

an inorganic insulating layer covering the shielding layer;

a semiconductor layer located on the inorganic insulating layer;

a gate insulating layer covering the semiconductor layer; and a gate layer located on the gate insulating layer.

15. The display apparatus of claim 14, wherein the metal wiring is located on the gate insulating layer.

16. The display apparatus of claim 14, wherein the display panel further comprises:

an interlayer insulating layer covering the gate layer; and a conductive layer located on the interlayer insulating layer, and the metal wiring is located on the interlayer insulating layer.

17. The display apparatus of claim 16, wherein the metal wiring and the conductive layer include a same material.

18. The display apparatus of claim 14, wherein the shielding portion and the shielding layer are located on a same layer.

19. The display apparatus of claim 14, wherein the shielding portion and the shielding layer include a same material.

20. The display apparatus of claim 11, wherein the display panel further comprises a driving voltage wiring located between the opening portion and the gate driving part in a plan view, and the shielding portion to block external light and prevent external light from impinging on the metal wiring.

* * * * *